US008603731B2

(12) United States Patent
Enomoto et al.

(10) Patent No.: US 8,603,731 B2
(45) Date of Patent: Dec. 10, 2013

(54) RESIST UNDERLAYER FILM FORMING COMPOSITION FOR ELECTRON BEAM LITHOGRAPHY

(75) Inventors: Tomoyuki Enomoto, Toyama (JP); Takahiro Sakaguchi, Toyama (JP); Rikimaru Sakamoto, Toyama (JP); Masaki Nagai, Tokyo (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 105 days.

(21) Appl. No.: 12/449,737

(22) PCT Filed: Feb. 19, 2008

(86) PCT No.: PCT/JP2008/052740
§ 371 (c)(1),
(2), (4) Date: Aug. 25, 2009

(87) PCT Pub. No.: WO2008/105266
PCT Pub. Date: Sep. 4, 2008

(65) Prior Publication Data
US 2010/0081081 A1 Apr. 1, 2010

(30) Foreign Application Priority Data

Feb. 27, 2007 (JP) ................................. 2007-046922

(51) Int. Cl.
G03F 7/40 (2006.01)
H01L 21/027 (2006.01)
G03F 7/11 (2006.01)

(52) U.S. Cl.
USPC ........................................ 430/296; 430/271.1

(58) Field of Classification Search
None
See application file for complete search history.

(56) References Cited

U.S. PATENT DOCUMENTS

| 4,968,583 | A | * | 11/1990 | Ohshio et al. .................. 430/296 |
| 5,019,485 | A | * | 5/1991 | Nakamura et al. ............. 430/296 |
| 5,372,914 | A | * | 12/1994 | Naito et al. .................... 430/296 |
| 5,525,457 | A | * | 6/1996 | Nemoto et al. ................ 430/325 |
| 5,693,691 | A |  | 12/1997 | Flaim et al. |
| 5,919,599 | A |  | 7/1999 | Meador et al. |
| 6,337,163 | B1 | * | 1/2002 | Sato .................................. 430/30 |
| 6,342,322 | B1 | * | 1/2002 | Kakinuma et al. ............... 430/17 |
| 7,736,822 | B2 | * | 6/2010 | Hashimoto et al. ................ 430/5 |
| 2005/0008964 | A1 |  | 1/2005 | Takei et al. |
| 2005/0118749 | A1 | * | 6/2005 | Sakamoto et al. ............. 438/107 |
| 2007/0190459 | A1 | * | 8/2007 | Hashimoto et al. ......... 430/270.1 |
| 2007/0238029 | A1 | * | 10/2007 | Takei et al. ........................ 430/5 |

FOREIGN PATENT DOCUMENTS

| JP | A-63-129622 | | 6/1988 |
| JP | 01-118127 a | * | 5/1989 |
| JP | A-2002-333717 | | 11/2002 |
| JP | A-2007-17949 | | 1/2007 |
| WO | WO 03/034152 A1 | | 4/2003 |
| WO | WO 03/071357 A1 | | 8/2003 |
| WO | WO 2006/003850 A1 | | 1/2006 |

OTHER PUBLICATIONS

"Calcination", IUPAC Goldbook online version, 2 pages original source, PAC, 2007, 79,1801 (Definitions aof terms relating to the structure and processing of soles, gels, networks and inorganic-organic hybrid materials ((UPAC REcommendations 2007)) on p. 1821 from http://goldbook.iupac.org/C00773.html downloaded Oct. 20, 2010.*
Calcination, Knovel—Knovel content,one page from www.knovel.com source Hawley\'s Condensed Chemical Dictionary, 14th Ed. Copyright 2002, JOhn Wiley & Sons, Inc. down loaded Oct. 20, 2010.*
Define: calcination—Google Search of Oct. 20, 2010 from www.google.com, 2 pages.*
Extended Search Report issued in corresponding European Application No. 08711564.8 dated Mar. 9, 2011.
Taylor et al., "Methacrylate Resists and Antireflective Coatings for 193 nm Lithography," SPIE, Mar. 1999, pp. 174-185, vol. 3678, Santa Clara, California, U.S.
Meador et al., "Recent Progress in 193 nm Antireflective Coatings," SPIE, Mar. 1999, pp. 800-809, vol. 3678, Santa Clara, California, U.S.
Lynch et al., "Properties and Performance of Near UV Reflectivity Control Layers," SPIE, 1994, pp. 225-235, vol. 2195.
International Search Report for International Application No. PCT/JP2008/052740, issued on Mar. 18, 2008, pp. 1-2, ISA: Japanese Patent Office.

* cited by examiner

Primary Examiner — Cynthia Hamilton
(74) Attorney, Agent, or Firm — Oliff & Berridge, PLC

(57) ABSTRACT

There is provided a resist underlayer film forming composition for an electron beam lithography that is used in a device production process using electron beam lithography and is effective for reducing adverse effects caused by an electron beam to obtain a favorable resist pattern, and a method of forming a resist pattern using the resist underlayer film forming composition for electron beam lithography. The resist underlayer film forming composition for an electron beam lithography comprises a polymer compound having a repeating unit structure that contains a halogen atom, and a solvent, and the composition is applied in a form of film between a film to be processed for forming a transferring pattern on a substrate and a resist film for an electron beam lithography, and used for manufacturing a semiconductor device. The polymer compound preferably contains at least 10% by mass of a halogen atom.

6 Claims, No Drawings

RESIST UNDERLAYER FILM FORMING COMPOSITION FOR ELECTRON BEAM LITHOGRAPHY

TECHNICAL FIELD

The present invention relates to a resist underlayer film forming composition for an electron beam lithography that is used in a device production process using electron beam lithography and is effective for reducing adverse effects caused by an electron beam to obtain a favorable resist pattern, and a method of forming a resist pattern using the resist underlayer film forming composition for electron beam lithography.

BACKGROUND ART

Conventionally, in the manufacturing of semiconductor devices, fine processing using a photolithography technology has been performed. The fine processing is a processing method including: forming a thin film of a photoresist composition on a substrate to be processed, such as silicon wafer; irradiating an activating light ray, such as ultra violet rays, onto the resultant thin film through a mask pattern in which a pattern of a semiconductor device is depicted to develop the pattern; and subjecting the substrate to be processed, such as silicon wafer, to etching processing using the resultant photoresist pattern as a protecting film. Recently, the high integration of semiconductor devices has been progressed and the activating light ray to be used has a shorter wavelength, from a KrF excimer laser (248 nm) to an ArF excimer laser (193 nm). Following such a tendency, the influence of diffuse reflection of an activating light ray from the substrate or of a standing wave has become a large problem. A method of providing a bottom anti-reflective coating (BARC) between the photoresist and the substrate to be processed as a resist underlayer film assuming a role of preventing reflection, has been widely adopted.

As such a bottom anti-reflective coating, there are known inorganic bottom anti-reflective coatings such as films of titanium, titanium dioxide, titanium nitride, chromium oxide, carbon, and α-silicon, and organic bottom anti-reflective coatings containing a light-absorptive substance and a polymer compound. The former requires in a film-forming process, equipment such as a vacuum evaporator, a CVD apparatus and a sputtering apparatus, while the latter requires no special equipment. Therefore, the latter is regarded as more advantageous, and many investigations thereon are carried out.

Examples of the organic bottom anti-reflective coatings include: an acrylic resin-based bottom anti-reflective coating having both a hydroxyl group which is a crosslinking reactive group and a light absorbing group within one molecule (see Patent Document 1); and a novolak resin-based bottom anti-reflective coating having both a hydroxyl group which is a crosslinking reactive group and a light absorbing group within one molecule (see Patent Document 2).

As physical properties desired for the organic bottom anti-reflective coating material, there are described: having a large absorbance relative to light or radiation; causing no intermixing with a photoresist layer (being insoluble in a resist solvent); causing no diffusion of low molecule substances from the bottom anti-reflective coating material to the inside of the overcoat resist during application or drying by heating; having a larger dry etching rate than that of the photoresist; and the like (see Non-patent Document 1).

Recently, as a next-generation photolithography technology succeeding the photolithography technology that uses an ArF excimer laser (193 nm), there is vigorously studied an ArF immersion lithography technology in which exposure is performed through water. However, the photolithography technology using light is reaching the limit, and as a new lithography technology after the ArF immersion lithography technology, an electron beam lithography technology using an electron beam has been receiving attention.

In a device production process using electron beam lithography, due to adverse effects caused by a base substrate or an electron beam, the pattern of a resist for electron beam lithography becomes in a trailing shape or an undercut shape, so that there are caused such problems that a favorable resist pattern in a straight shape cannot be formed and that a satisfactory margin relative to an electron beam irradiance level cannot be obtained. Therefore, in an electron beam lithography process, a resist underlayer film (bottom anti-reflective coating) having a reflection preventing function is unnecessary. However, there becomes necessary a resist underlayer film for electron beam lithography capable of obtaining a satisfactory margin relative to an electron beam irradiance level by reducing the above adverse effects to form a favorable resist pattern in a straight shape.

In addition, since a resist is applied on the resist underlayer film for electron beam lithography after the resist underlayer film is formed, it is essential characteristics of the resist underlayer film for electron beam lithography to cause no intermixing with the resist layer (being insoluble in a resist solvent) and to cause no diffusion of low molecule substances from a bottom anti-reflective coating material to the inside of the overcoat resist while applying or heating-drying.

Furthermore, in a generation using electron beam lithography, a resist pattern width becomes extremely fine, so that a resist for electron beam lithography is desired to be thinned. Therefore, it is necessary to significantly reduce the time for a process of removing an organic bottom anti-reflective coating by etching and there is required a resist underlayer film for electron beam lithography capable of being used in a thin film form or a resist underlayer film for electron beam lithography having a large selection ratio of an etching rate relative to a resist for electron beam lithography.

Patent Document 1

U.S. Pat. No. 5,919,599 Specification

Patent Document 2

U.S. Pat. No. 5,693,691 Specification

Non-Patent Document 1

Proc. of SPIE, 1999, Vol. 3678, pp. 174-185; Proc. of SPIE, 1999, Vol. 3678, pp. 800-809; and Proc. of SPIE, 1994, Vol. 2195, pp. 225-229

DISCLOSURE OF THE INVENTION

Problems to be Solved by the Invention

It is an object of the present invention to provide a resist underlayer film forming composition for electron beam lithography for use in an electron beam lithography process for the manufacturing of semiconductor devices. In addition, it is another object of the present invention to provide a resist underlayer film for electron beam lithography that: reduces adverse effects caused by a base substrate or an electron beam to form a favorable resist pattern in a straight shape so that a satisfactory margin relative to an electron beam irradiance level can be obtained; and causes no intermixing with a resist layer; and has a dry etching rate larger than that of the resist. Furthermore, it is still another object of the present invention to provide a method of forming a pattern of a resist for electron beam lithography using the resist underlayer film forming composition for electron beam lithography.

Means for Solving the Problems

The present invention provides, according to a first aspect, a resist underlayer film forming composition for an electron beam lithography process for manufacturing a semiconductor device including a polymer compound having a repeating unit structure that contains a halogen atom, and a solvent;

according to a second aspect, in the resist underlayer film forming composition for electron beam lithography according to the first aspect, the polymer compound contains at least 10% by mass of a halogen atom, based on the total mass of the polymer compound;

according to a third aspect, in the resist underlayer film forming composition for electron beam lithography according to the first aspect or the second aspect, the polymer compound is represented by Formula (1):

[Chemical Formula 1]

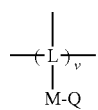

Formula (1)

(where, L represents a bonding group constituting the backbone of the polymer compound; M represents a direct bond or a linking group containing at least one selected from —C(=O)—, —CH$_2$— or —O—; Q represents an organic group; at least one of L, M and Q contains a halogen atom; and V represents the number of a unit structure contained in the polymer compound, which is the number of 1 to 3,000);

according to a fourth aspect, in the resist underlayer film forming composition for electron beam lithography according to the third aspect, L in the above formula is the backbone of an acrylic or novolak-based polymer compound;

according to a fifth aspect, in the resist underlayer film forming composition for electron beam lithography according to any one of the first aspect to the fourth aspect, the halogen atom is a chlorine atom, a bromine atom or an iodine atom;

according to a sixth aspect, the resist underlayer film forming composition for electron beam lithography according to any one of the first aspect to the fifth aspect, further containing a crosslinking agent and a crosslinking catalyst in addition to the polymer compound and the solvent;

according to a seventh aspect, the resist underlayer film forming composition for electron beam lithography according to any one of the first aspect to the sixth aspect, further containing an acid generator in addition to the polymer compound and the solvent;

according to an eighth aspect, in the resist underlayer film forming composition for electron beam lithography according to any one of the first aspect to the seventh aspect, the polymer compound has a weight average molecular mass of 500 to 1,000,000;

according to a ninth aspect, a method of forming a resist underlayer film for electron beam lithography used in a lithography process for manufacturing a semiconductor device, including: applying the resist underlayer film forming composition for electron beam lithography as described in any one of the first aspect to the eighth aspect on a substrate; and calcining the composition to obtain the resist underlayer film; and according to a tenth aspect, a method of manufacturing a semiconductor device including:

forming a resist underlayer film for electron beam lithography by applying the resist underlayer film forming composition for electron beam lithography as described in any one of the first aspect to the eighth aspect on a substrate having a film to be processed on which a transferring pattern is formed and by calcining the composition;

coating the obtained resist underlayer film with a resist for electron beam lithography; and forming an integrated circuit element by: irradiating an electron beam to the substrate coated with the resist underlayer film for electron beam lithography and the resist for electron beam lithography; carrying out development; and performing dry-etching to transfer an image onto the substrate.

Effects of the Invention

With the resist underlayer film obtained from the resist underlayer film forming composition for electron beam lithography of the present invention, it is possible to reduce adverse effects caused by a base substrate or an electron beam to form a favorable resist pattern in a straight shape and obtain a satisfactory margin relative to an electron beam irradiance level. In addition, the present resist underlayer film has a dry-etching rate larger than that of a resist film formed on the resist underlayer film, and therefore, it is possible to easily transfer a resist pattern to a base film to be processed by a dry-etching process.

Furthermore, the underlayer film formed using the resist underlayer film forming composition for electron beam lithography of the present invention is also excellent in adhesion with a resist film or a base film.

As contrasted with a resist underlayer film (bottom anti-reflective coating) used in a photolithography process for preventing reflected light generated from a substrate, the resist underlayer film for electron beam lithography of the present invention enables formation of a clear resist pattern during irradiation of an electron beam by forming the resist underlayer film under a resist film for electron beam lithography, without requiring an effect of preventing reflected light.

BEST MODES FOR CARRYING OUT THE INVENTION

The present invention is a resist underlayer film forming composition for electron beam lithography that includes a polymer compound having a repeating unit structure containing halogen atoms, and a solvent, and that is used in the manufacturing of semiconductor devices using an electron beam lithography technology. The resist underlayer film forming composition for electron beam lithography of the present invention is used for forming a resist underlayer film between the resist film and a base film on a substrate, to which a resist pattern is transferred.

The resist underlayer film forming composition for electron beam lithography of the present invention is fundamentally a composition including a polymer compound having a repeating unit structure that contains halogen atoms and a solvent, a composition including a polymer compound having a repeating unit structure that contains halogen atoms and a crosslinkage-forming substituent and a solvent, or a composition including a polymer compound having a repeating unit structure that contains halogen atoms and a repeating unit structure that contains a crosslinkage-forming substituent and a solvent. The underlayer film forming composition contains as optional components, a crosslinking catalyst, a surfactant or the like.

The resist underlayer film forming composition for electron beam lithography of the present invention has a solid content of 0.1 to 50% by mass, preferably 0.5 to 30% by mass. The solid content is a component remained after removing a solvent component from the resist underlayer film forming composition for electron beam lithography.

The content of the polymer compound in the resist underlayer film forming composition for electron beam lithography is 20% by mass or more, for example 20 to 100% by mass, or 30 to 100% by mass, or 50 to 90% by mass, or 60 to 80% by mass, based on the mass of the solid content.

In addition, the polymer compound contains halogen atoms in an amount of at least 10% by mass, preferably 10 to 80% by mass, more preferably 20 to 70% by mass.

The halogen atom is contained in an L part corresponding to the backbone in Formula (1), in an M part corresponding to a linking group in Formula (1), in a Q corresponding to an organic group in Formula (1), or in a combination part thereof.

Although the halogen atoms include a fluorine atom, a chlorine atom, a bromine atom and an iodine atom, particularly a chlorine atom, a bromine atom, an iodine atom or a combination thereof is preferred.

The polymer compound may contain crosslinkage-forming substituents. Examples of such crosslinkage-forming substituents include a hydroxyl group, an amino group, a carboxyl group, a thiol group and a methoxy group and the substituents are introduced into the backbone and/or side chains of the polymer compound.

The introduced crosslinkage-forming substituents can effect a crosslinking reaction with crosslinking agent components introduced into the resist underlayer film forming composition of the present invention when heating and calcining. A resist underlayer film formed by such a crosslinkage-forming reaction has an effect of preventing an intermixing with a resist film coated on the resist underlayer film as an upper layer thereof.

The polymer compound containing halogen atoms can be synthesized by a polymerization reaction of a unit monomer containing halogen atoms or by a copolymerization reaction of a unit monomer containing halogen atoms with a unit monomer containing no halogen atom.

When no crosslinkage-forming substituent exist in the unit monomer containing halogen atoms, a crosslinkage-forming substituent can exist in a unit monomer containing no halogen atom.

The unit monomer used in the polymerization reaction may be of one type, however, two or more types of unit monomers may also be used. The polymer compound formed with a unit monomer can be synthesized by a method such as a radical polymerization, an anion polymerization, a cation polymerization and a condensation polymerization. As the form of the method, there are possible methods such as a solution polymerization, a suspension polymerization, an emulsion polymerization and a block polymerization Examples of the unit monomer having halogen atoms include acrylic acids, acrylate esters, amide acrylates, methacrylic acids, methacrylic acids, methacrylate esters, methacrylic acid amides, vinyl ethers, vinyl alcohols, styrenes, benzenes, phenols, naphthalenes and naphthanols.

In addition, examples of the unit monomer having no halogen atom include acrylic acids, acrylate esters, amide acrylates, methacrylic acids, methacrylic acids, methacrylate esters, methacrylic acid amides, vinyl ethers, vinyl alcohols, styrenes, benzenes, phenols, naphthalenes and naphthanols.

Although L in the structure of Formula (1) is not particularly limited so long as L is a bonding group constituting the backbone of the polymer compound, examples of the structure of Formula (1) include (a-1) to (a-11):

[Chemical Formula 2]

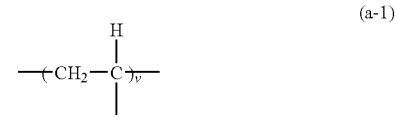

(a-1)

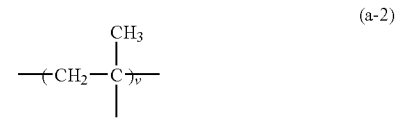

(a-2)

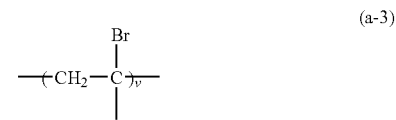

(a-3)

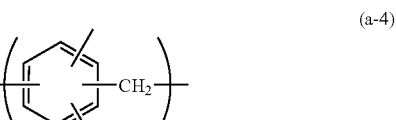

(a-4)

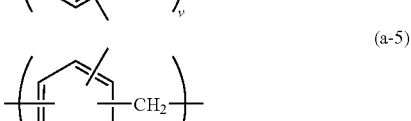

(a-5)

(a-6)

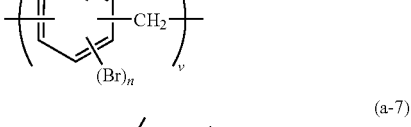

(a-7)

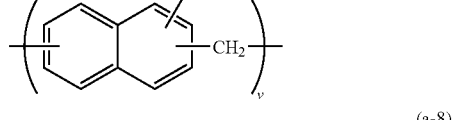

(a-8)

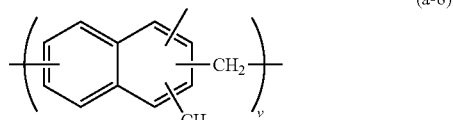

(a-9)

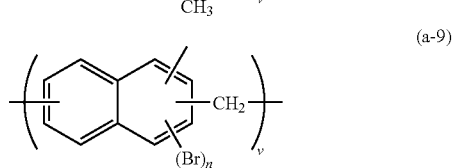

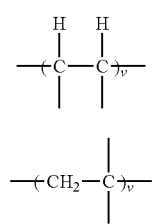

In the above formulae, v represents the number of repeating units which is 1 to 3,000, and n represents the number of halogen atoms replaced in a benzene ring or a naphthalene ring. The number of n is an arbitral integer in a range of from 1 or more to the largest number of halogen atoms which can be replaced.

Examples of M in Formula (1) include direct bondings; linking groups such as —C(=O)—, —C(=O)O—, —CH$_2$—, —CH(I)—, —O—, —C(=O)O—CH$_2$—, —C(=O)—NH—, —C(=O)—NH—CH$_2$—, —OC(=O)— and —OC(=O)—CH$_2$—; and further (b-1) to (b-10):

[Chemical Formula 3]

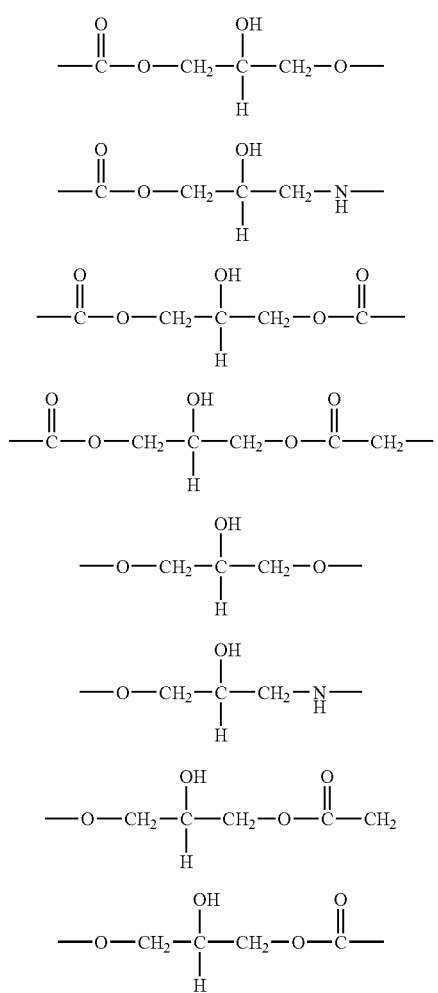

In addition, examples of the Q part in Formula (1) include halogen atoms and organic groups having halogen atoms represented by (c-1) to (c-10):

[Chemical Formula 4]

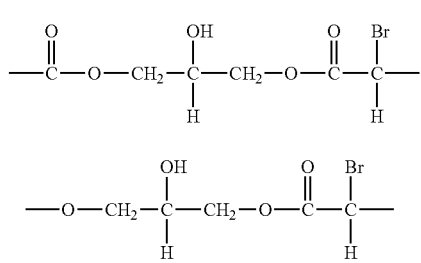

-continued
(c-8) 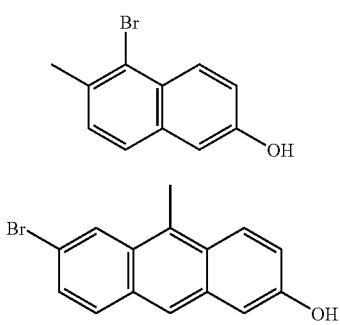
(c-9) 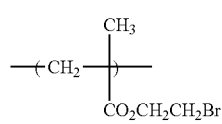
(c-10) 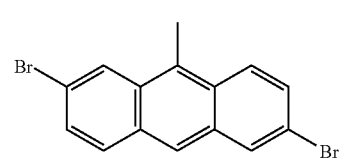
Specific examples of the halogen atom-containing repeating unit structure contained in the polymer compound include structures represented by (1-1) to (1-34), (2-1) to (2-30) and (3-1) to (3-27):
[Chemical Formula 5]
[1-1] 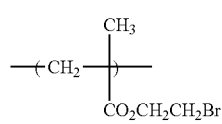
[1-2] 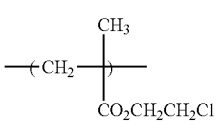
[1-3] 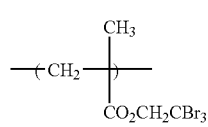
[1-4] 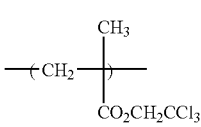
[1-5] 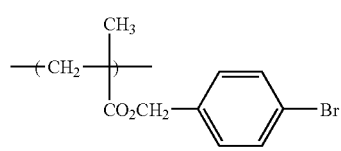
[1-6] 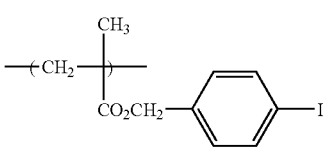
[1-7] 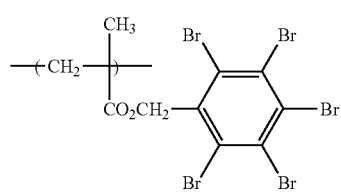
[1-8] 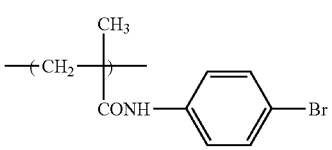
[1-9] 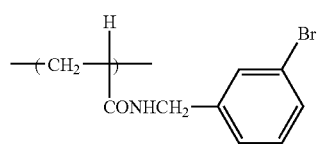
[1-10] 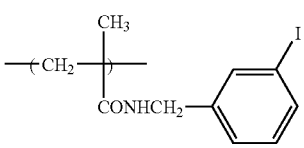
[1-11] 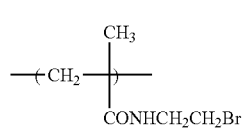
[1-12] 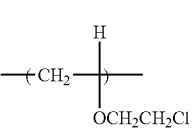
[1-13] 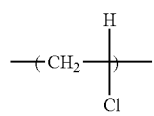
[1-14] 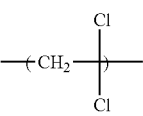

[Chemical Formula 6]
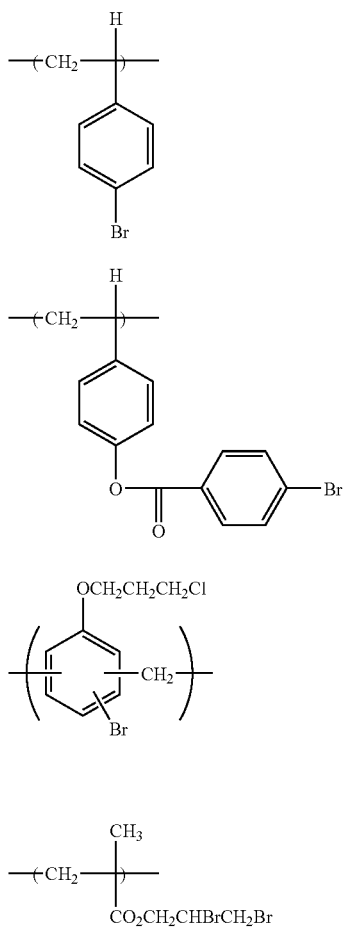
[1-15]
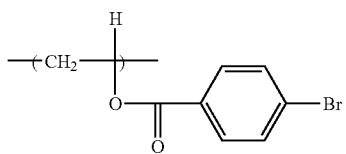
[1-16]
[1-17]
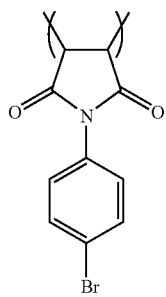
[1-18]
[1-19]
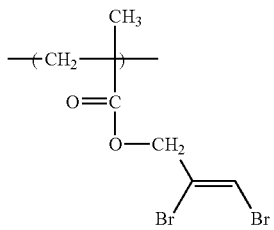
[1-20]
[1-21]
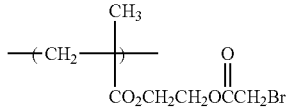
[1-22]
[Chemical Formula 7]
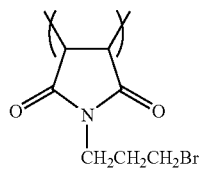
[1-24]
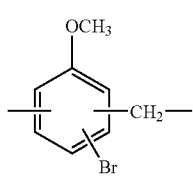
[1-25]
[1-26]
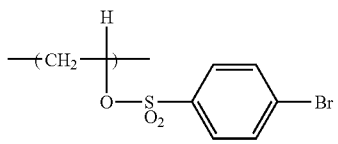
[1-27]
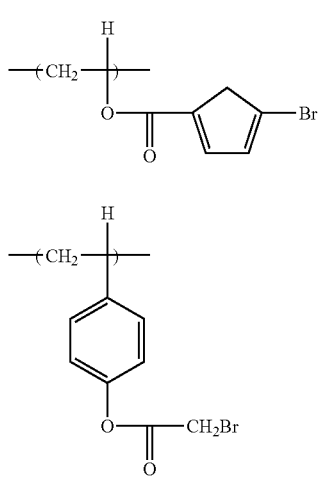
[1-23]

[Chemical Formula 8]
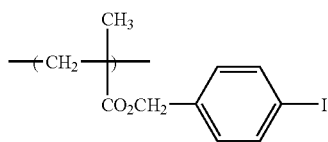 [1-28]
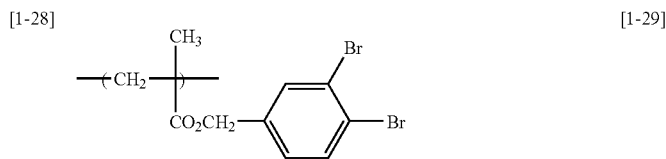 [1-29]
[Chemical Formula 9]
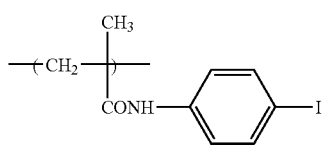 [1-30]
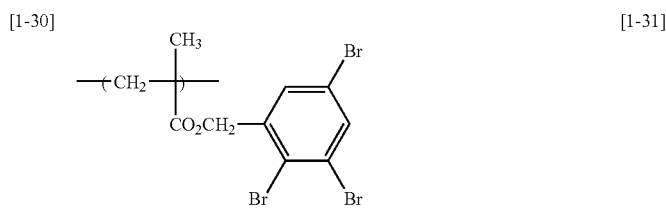 [1-31]
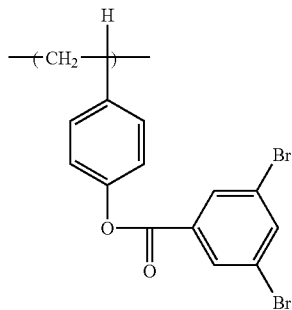 [1-32]
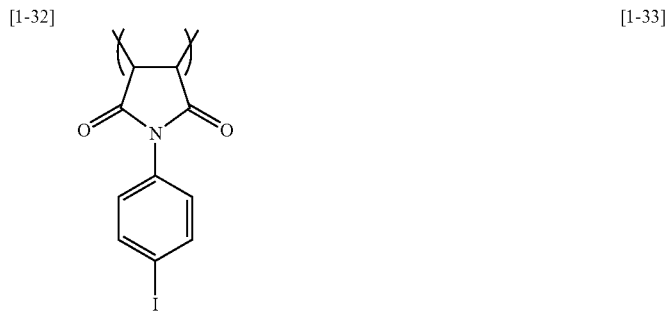 [1-33]
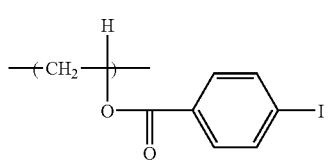 [1-34]
[Chemical Formula 10]
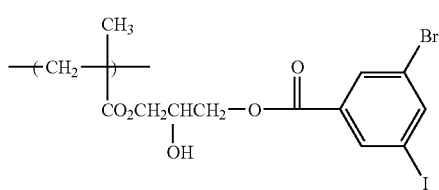 [2-1]
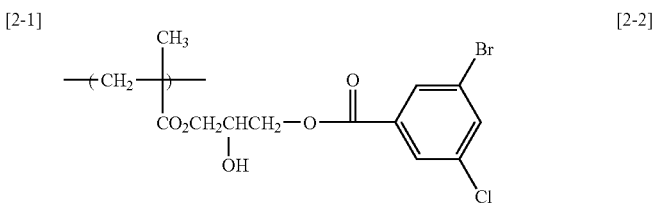 [2-2]

-continued
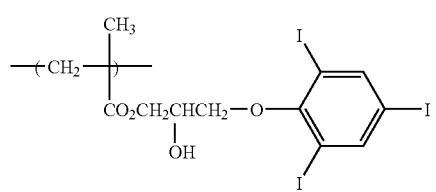
[2-3]
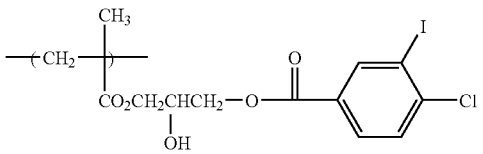
[2-4]
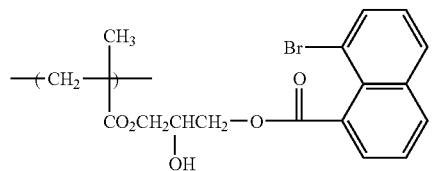
[2-5]
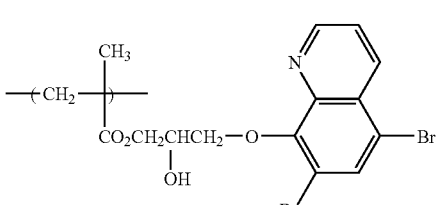
[2-6]
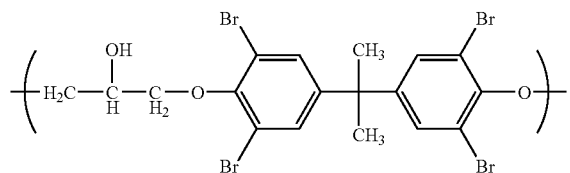
[2-7]
[Chemical Formula 11]
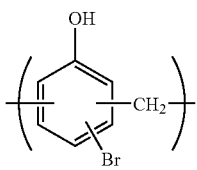
[2-8]
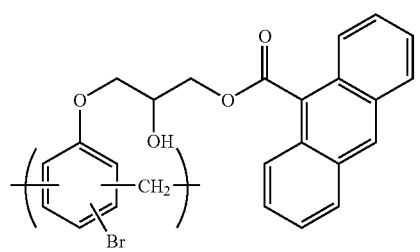
[2-9]
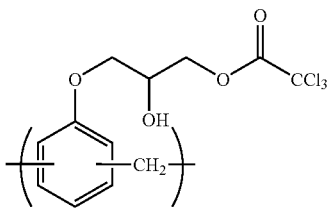
[2-10]
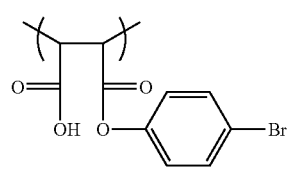
[2-11]
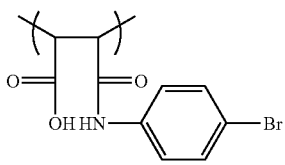
[2-12]
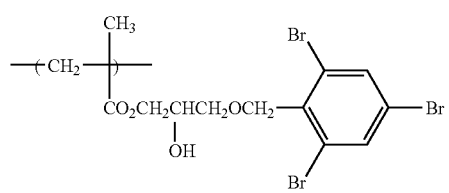
[2-13]
[Chemical Formula 12]
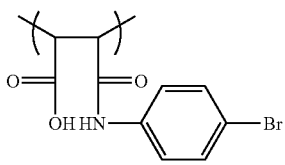
[2-14]
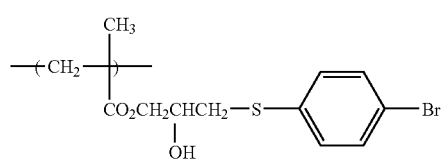
[2-15]
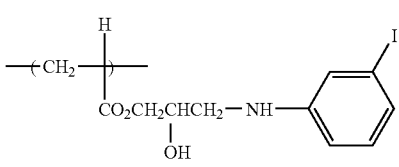
[2-16]
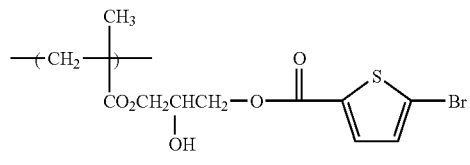
[2-17]
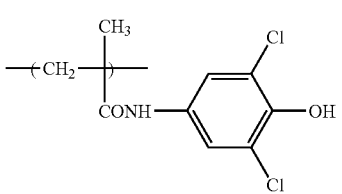
[2-18]

[2-19]
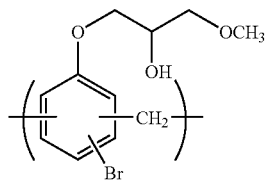
[2-20]
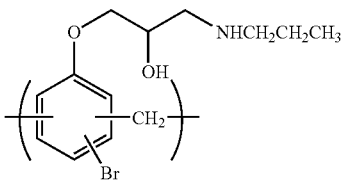
[2-21]
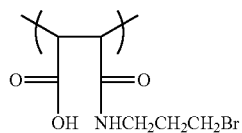
[2-22]
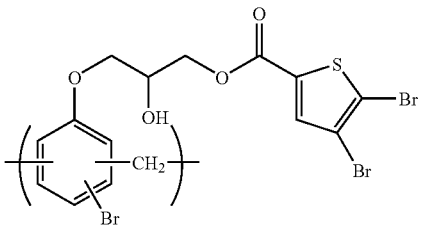
[Chemical Formula 13]
[2-23]
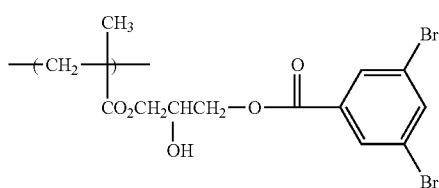
[2-24]
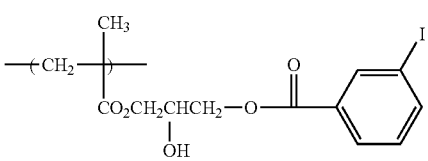
[2-25]
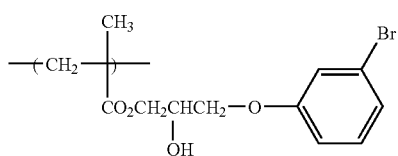
[2-26]
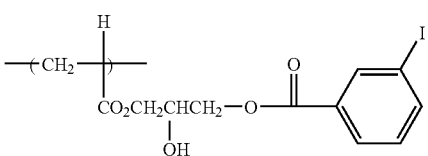
[2-27]
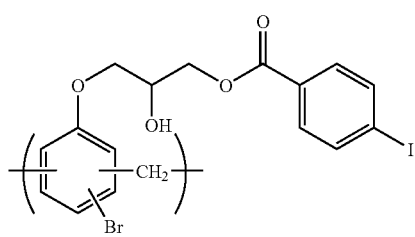
[2-28]
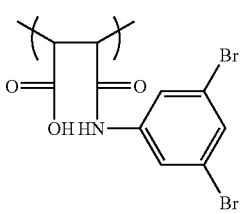
[2-29]
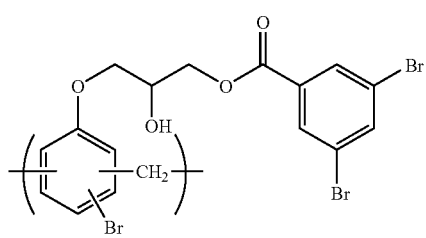
[2-30]
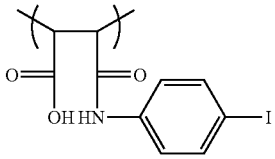
[Chemical Formula 14]
[3-1]
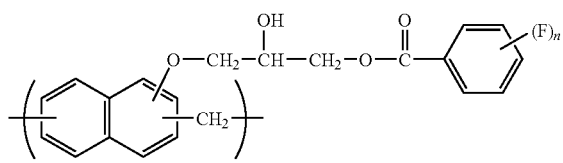
[3-2]
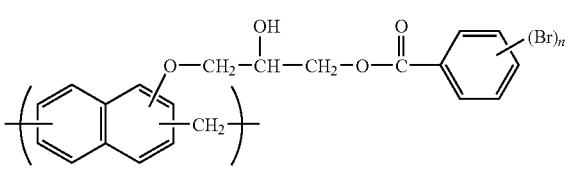

-continued
[3-3]
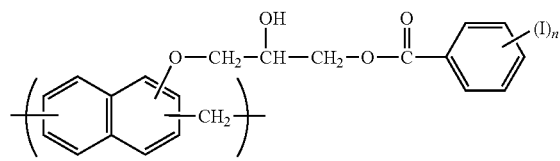
[3-4]
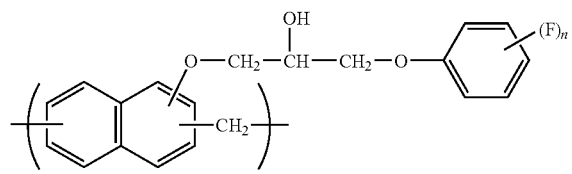
[3-5]
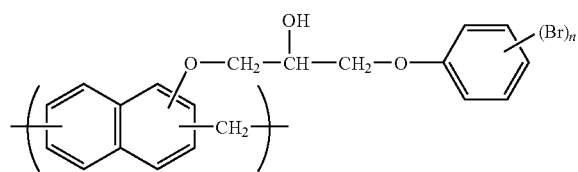
[3-6]
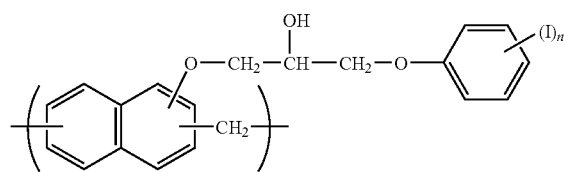
[Chemical Formula 15]
[3-7]
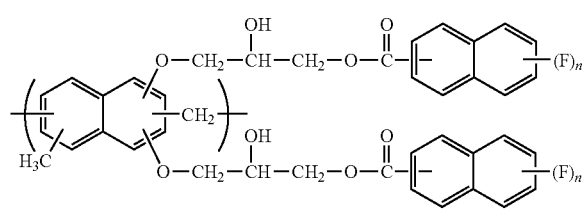
[3-8]
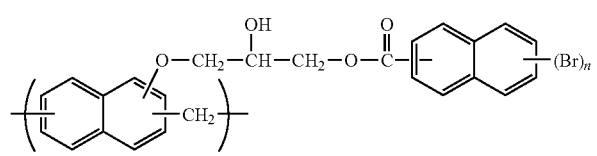
[3-9]
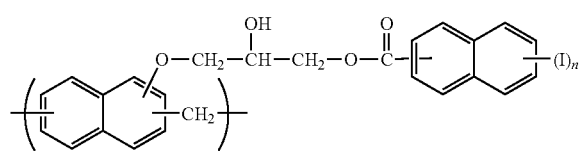
[3-10]
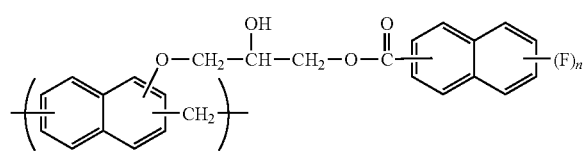
[3-11]
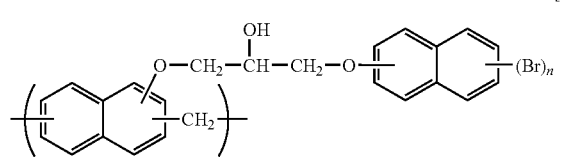
[3-12]
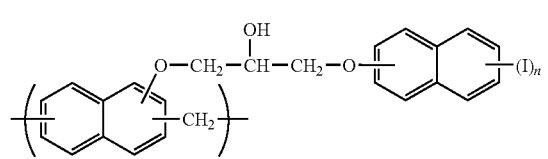
[Chemical Formula 16]
[3-13]
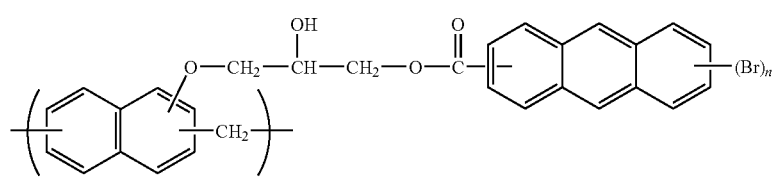
[3-14]
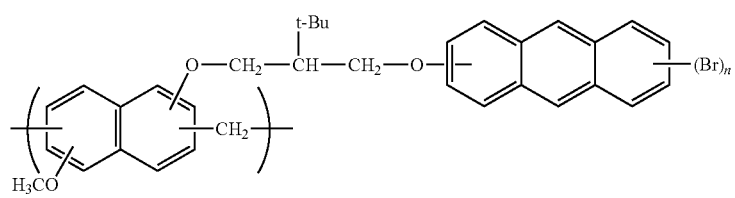
[3-15]
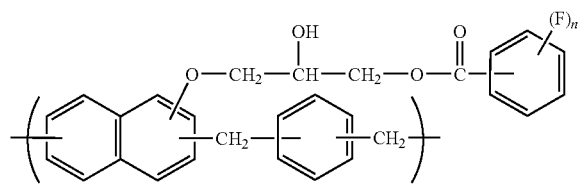
[3-16]
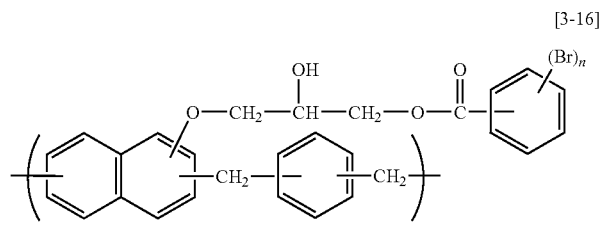

-continued
[3-17]
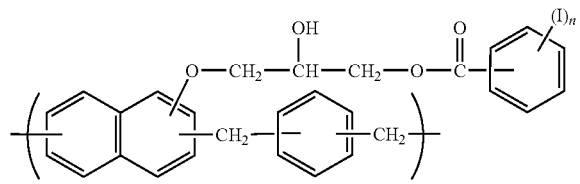
[3-18]
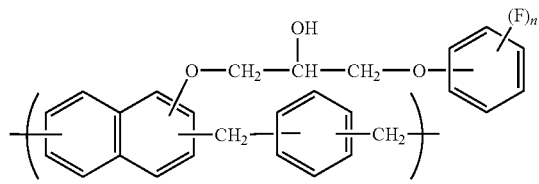
[Chemical Formula 17]
[3-19]
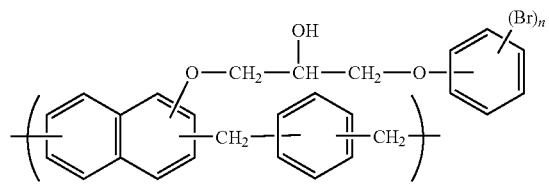
[3-20]
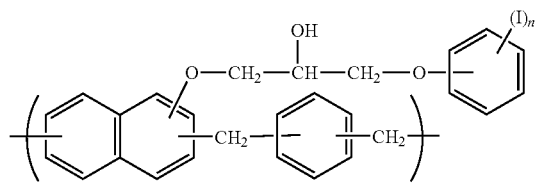
[3-21]
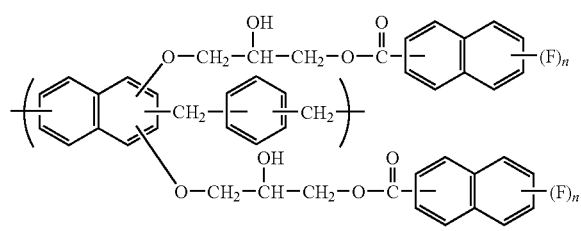
[3-22]
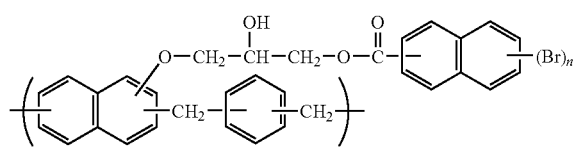
[3-23]
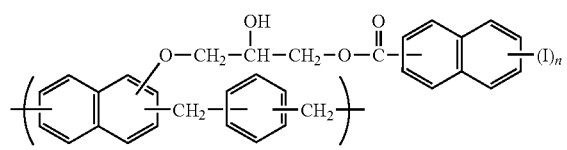
[Chemical Formula 18]
[3-24]
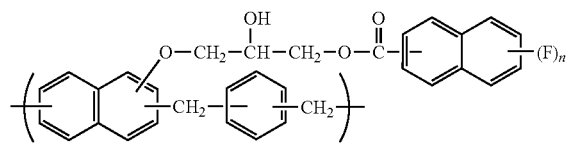
[3-25]
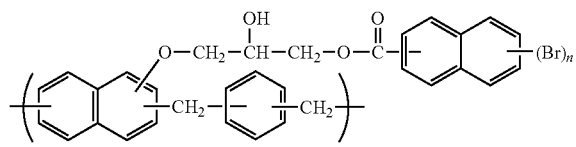
[3-26]
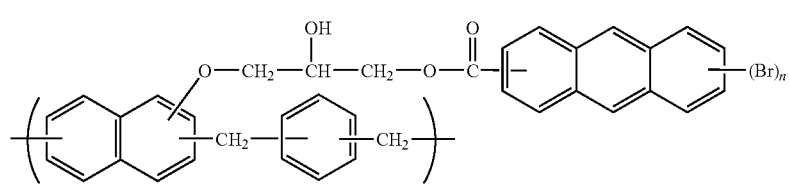
[3-27]
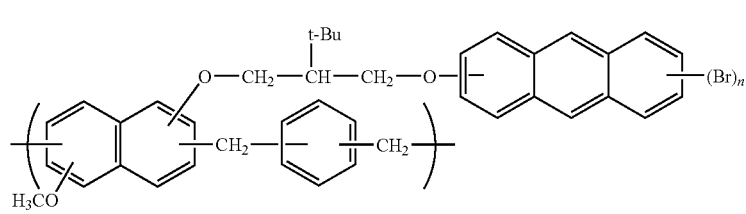

In Formulae (3-1) to (3-27), n represents the number of halogen atoms. The number is 1 to 5 in a benzene ring, 1 to 7 in a naphthalene ring, and 1 to 9 in an anthracene ring.

In addition, when no crosslinkage-forming group exists in a polymer compound containing halogen atoms, a unit monomer containing halogen atoms and a monomer of a repeating unit having no halogen atom and having a crosslinkage-forming group may be copolymerized. Examples of such a monomer structure include the following formulae:

[Chemical Formula 19]

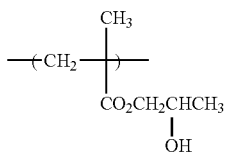
[4-1]

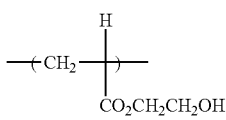
[4-2]

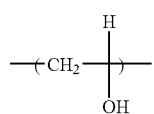
[4-3]

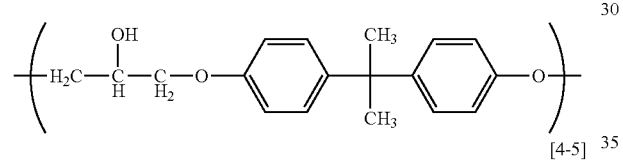
[4-4]

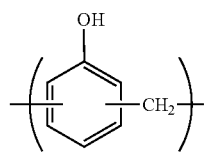
[4-5]

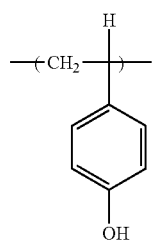
[4-6]

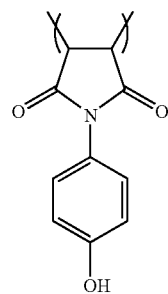
[4-7]

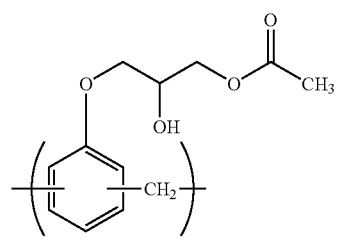
[4-8]

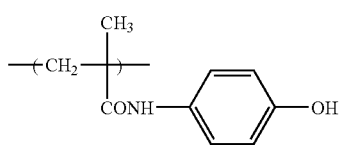
[4-9]

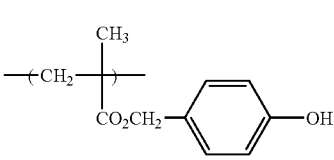
[4-10]

Specific examples of the polymer compound used in the resist underlayer film forming composition for electron beam lithography of the present invention include (5-1) to (5-56):

[Chemical Formula 20]

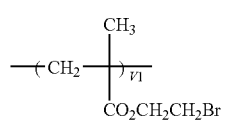 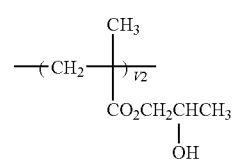
[5-1]

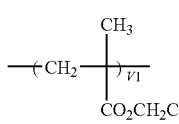 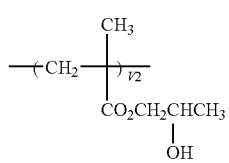
[5-2]

-continued
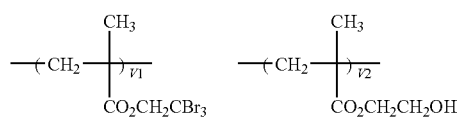 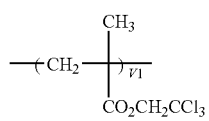 [5-3]
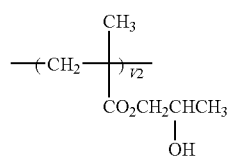 [5-4]
[5-5]
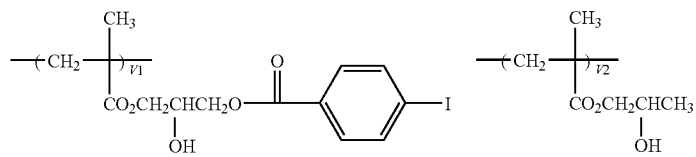
[Chemical Formula 21]
[5-6]
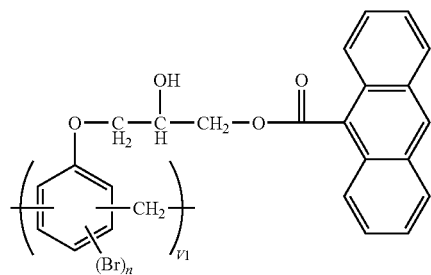
[5-7]
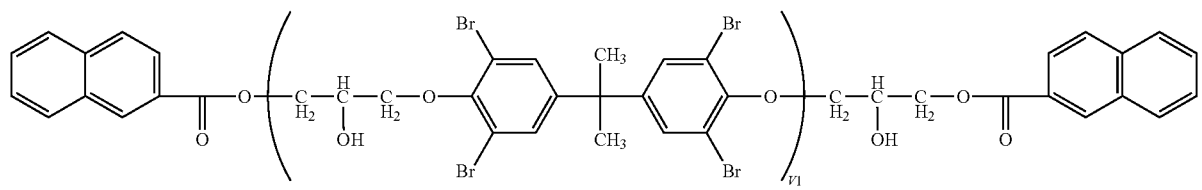
[5-8]
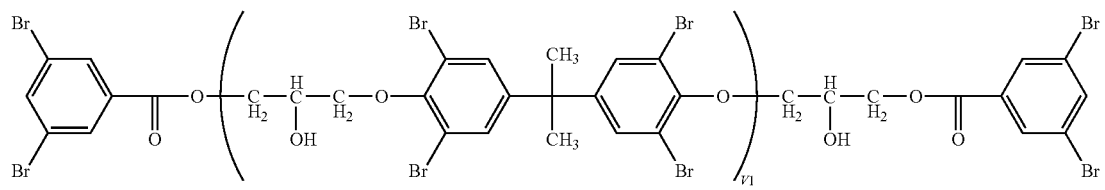
[5-9]
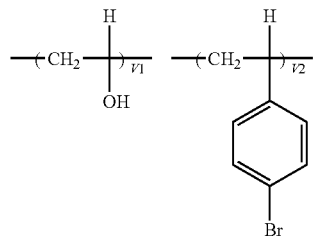
[Chemical Formula 22]
[5-10]
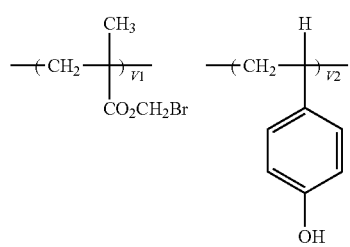
[5-11]

-continued
[5-12]
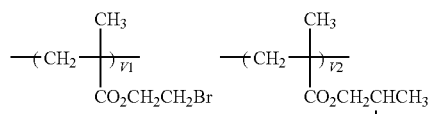
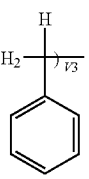
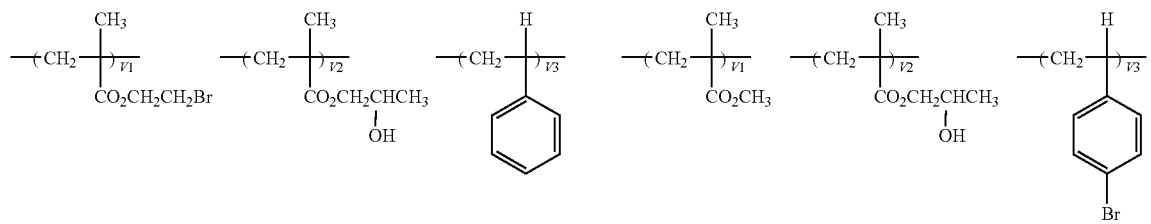
[5-13]
[5-14]
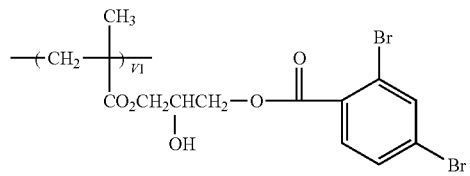
[Chemical Formula 23]
[5-15]
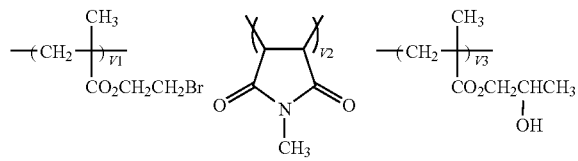
[5-16]
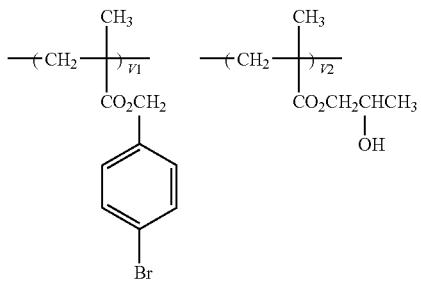
[5-17]
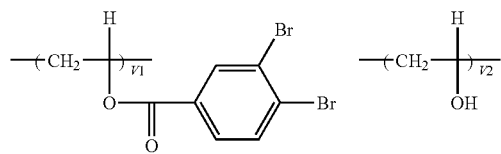
[5-18]
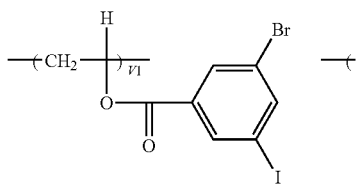
[5-19]
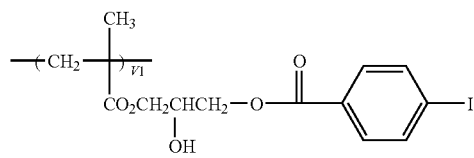
[Chemical Formula 24]
[5-20]
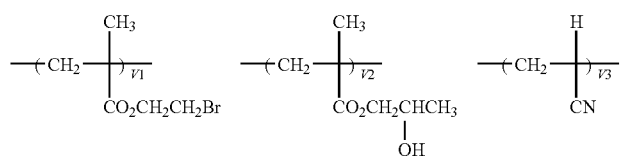
[5-21]
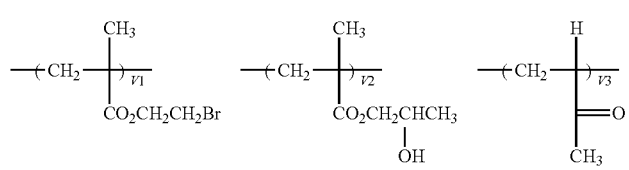

-continued
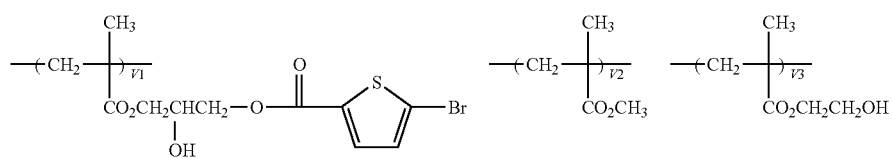
[5-22]
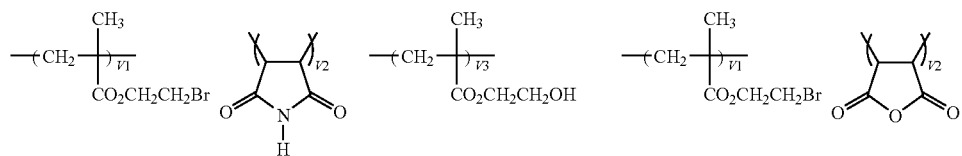
[5-23] [5-24]
[Chemical Formula 25]
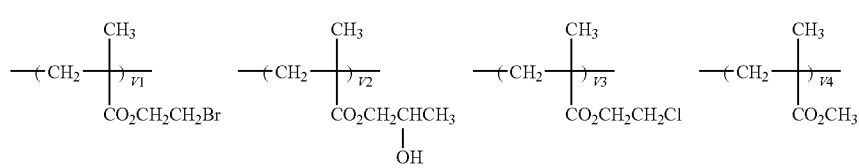
[5-25]
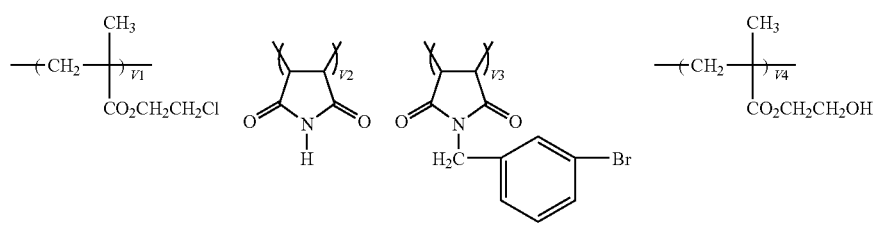
[5-26]
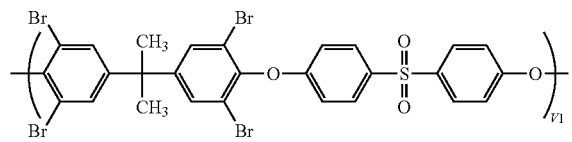
[5-27]
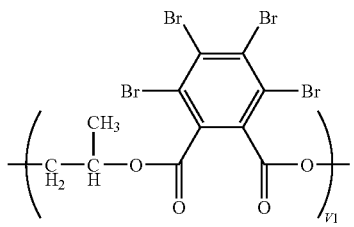
[5-28]
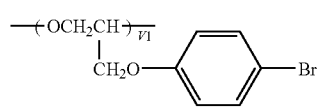
[5-29]
[Chemical Formula 26]
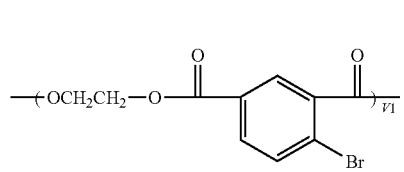
[5-30]
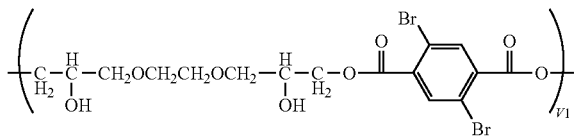
[5-31]
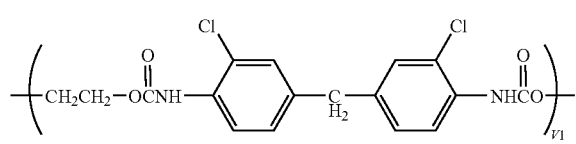
[5-32]

[Chemical Formula 27]
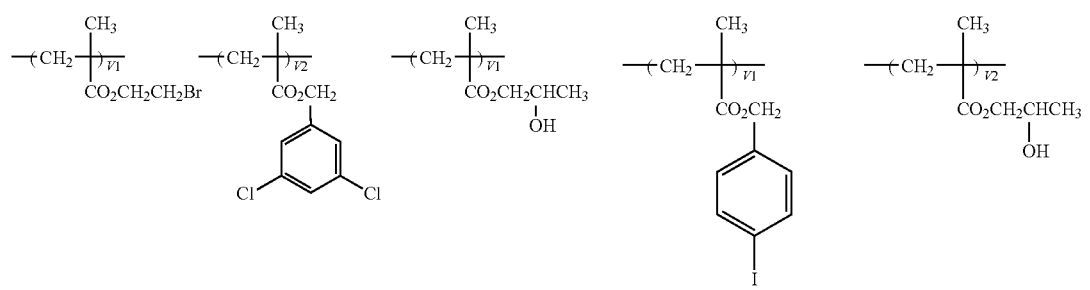
[Chemical Formula 28]
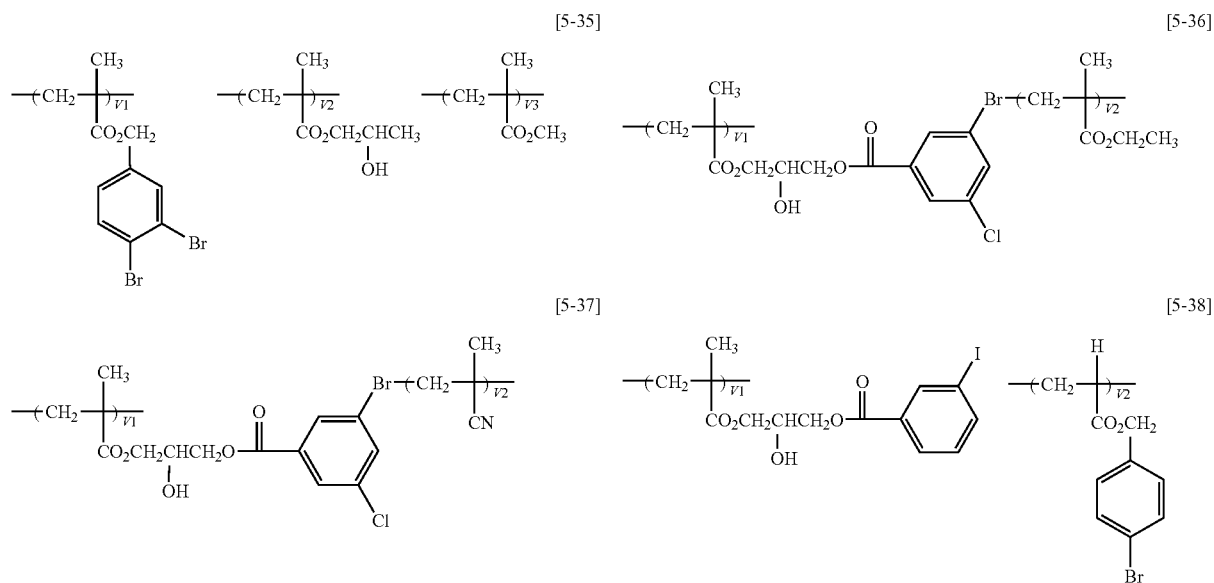
[Chemical Formula 29]
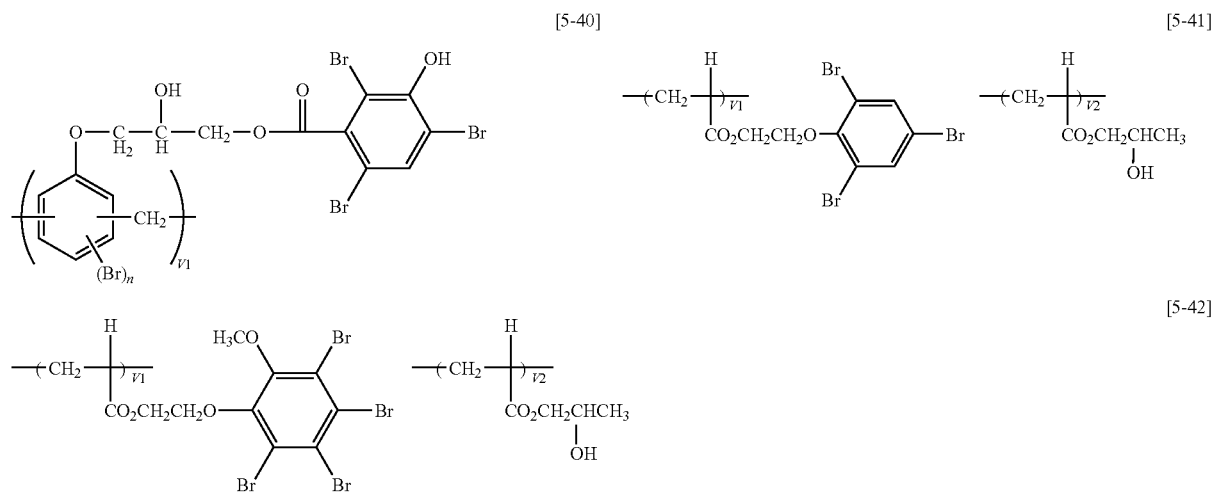

[Chemical Formula 30]
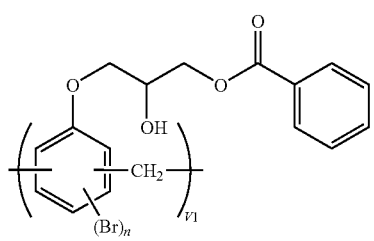
[5-42]
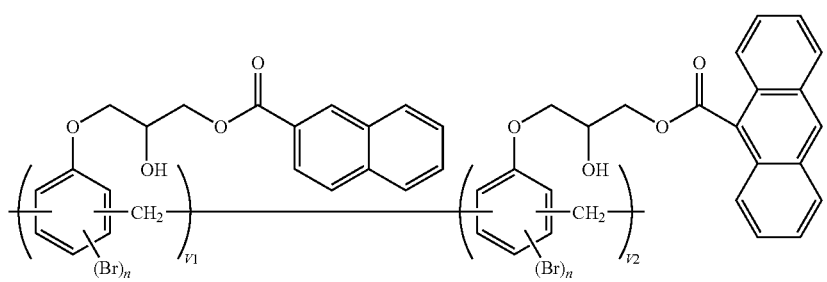
[5-43]
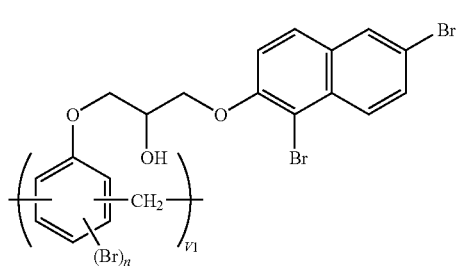
[5-44]
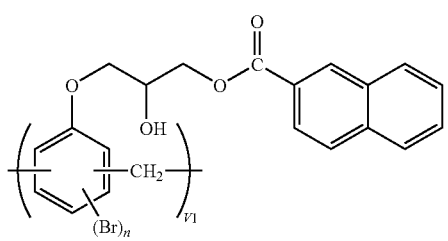
[5-45]
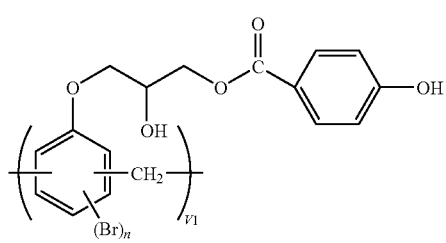
[5-46]
[Chemical Formula 31]
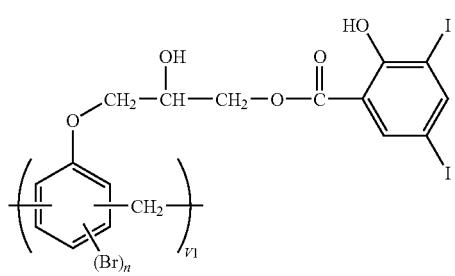
[5-47]
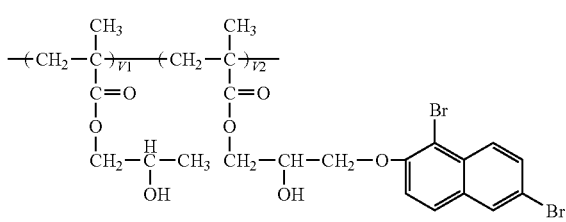
[5-48]

-continued
[5-49]
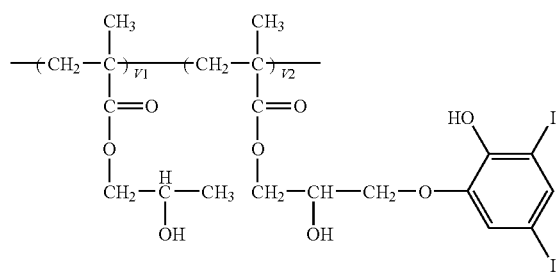
[5-50]
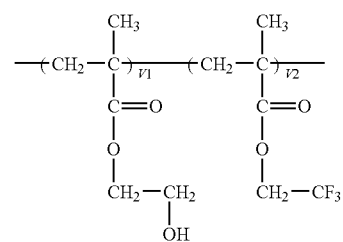
[5-51]
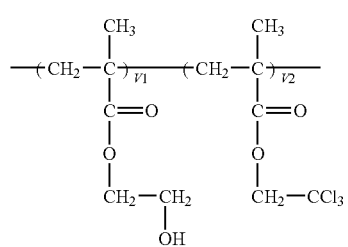
[Chemical Formula 32]
[5-52]
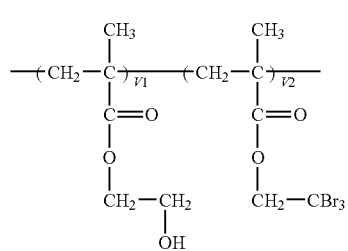
[5-53]
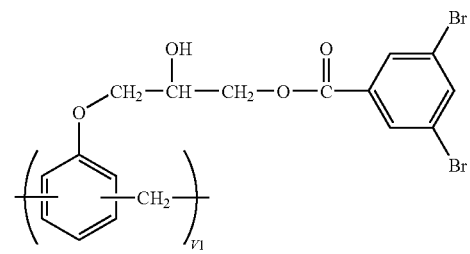
[5-54]
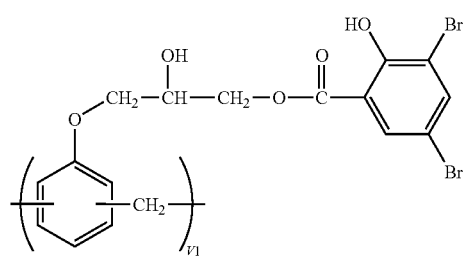
[5-55]
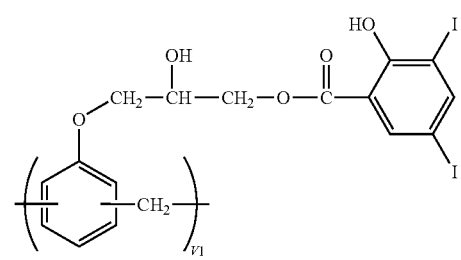
[5-56]
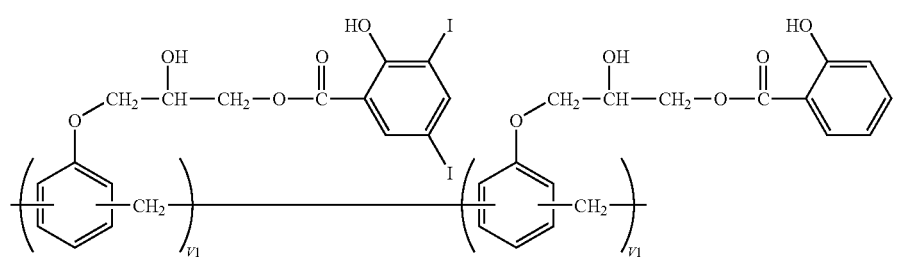

In (5-1) to (5-56), V1, V2 and V3 represent the numbers of repeating units. Each of the numbers is 1 or more, and the total number of repeating units of V1, V1+V2, V1+V2+V3 is 3,000 or less.

Then, each of polymers produced by homo-polymerizing monomers represented by (1-1) to (1-34), (2-1) to (2-30) and (3-1) to (3-27), each of copolymers of the above monomers and monomers represented by (4-1) to (4-10), or each of polymers represented by (5-1) to (5-56) described above as specific examples, has a weight average molecular mass of 500 to 1,000,000, preferably 500 to 500,000, more preferably 700 to 300,000.

The resist underlayer film forming composition for electron beam lithography of the present invention can vary the content (% by mass) of halogen atoms contained in the polymer compound in the composition. In other words, by selecting the backbone structure of the polymer compound, by selecting the type of the unit monomer used in the synthesis of the polymer compound, by selecting the type of the compound to be reacted with the polymer obtained by the polymerization reaction or by selecting the number and the type of the halogen atoms contained, the content (% by mass) of halogen atoms contained in the polymer compound can be varied. Then, by using polymer compounds having different halogen atom contents (% by mass), the halogen atom content (% by mass) in the solid content of the resist underlayer film forming composition, that is, the halogen atom content (% by mass) in the resist underlayer film after the film formation can be varied. Then, by varying the halogen atom content (% by mass) in the resist underlayer film after the film formation, the attenuation coefficient k value of the resist underlayer film can be controlled. In addition, the halogen atom content (% by mass) in the resist underlayer film after the film formation can be varied also by varying the ratio of a polymer compound having a certain halogen atom content in the solid content of the resist underlayer film forming composition. By this method, the attenuation coefficient k value of the resist underlayer film can be also controlled. Here, the solid content of the resist underlayer film forming composition refers to a component remained after removing a solvent component from the resist underlayer film forming composition, and the halogen atom content (% by mass) in the resist underlayer film after the film formation is regarded as the halogen atom content (% by mass) in the solid content of the resist underlayer film forming composition.

For preventing the intermixing of the resist underlayer film forming composition of the present invention with the photoresist overcoated on the resist underlayer film, the composition is preferably crosslinked by heating after coating, and the resist underlayer film forming composition of the present invention can further contain crosslinking agent components. Examples of the crosslinking agent include: melamine-based compounds and substituted urea-based compounds which have crosslinkage-forming substituents such as a methylol group and a methoxymethyl group; and polymer compounds containing epoxy groups. The crosslinking agent is preferably a crosslinking agent having at least two crosslinkage-forming substituents which is a compound such as methoxymethylated glycoluril or methoxymethylated melamine, and is particularly preferably tetramethoxymethyl glycoluril or hexamethoxymethylolmelamine. Although the additive amount of the crosslinking agent varies depending on the coating solvent used, the base substrate used, the solution viscosity required, the film shape required etc., the additive amount is 0.001 to 20% by mass, preferably 0.01 to 15% by mass, more preferably 0.05 to 10% by mass, relative to 100% by mass of the total mass of the composition. These crosslinking agents may effect a crosslinking reaction by a self condensation, however, when crosslinkage-forming substituents exist in the polymer compound used in the resist underlayer film forming composition of the present invention, the crosslinking agent can effect a crosslinking reaction with these crosslinkage-forming substituents.

The polymer compound that has a repeating unit structure containing halogen atoms and is used in the resist underlayer film forming composition for electron beam lithography of the present invention includes a repeating unit structure containing halogen atoms in the backbone thereof, a repeating unit structure containing halogen atoms in side chains thereof, or a combination thereof.

Preferred examples of the polymer compound having a repeating unit structure that contains halogen atoms include compounds represented by the following General Formulae (d), (e) and (f).

[Chemical Formula 33]

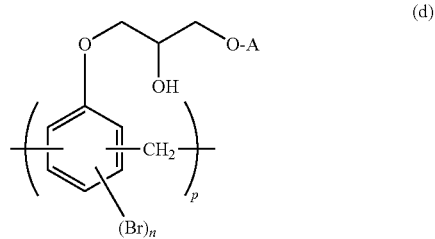

(where, A represents a phenyl group, a naphthyl group, an anthranil group, a benzoyl group, a naphthylcarbonyl group or an anthranilcarbonyl group (the phenyl group, the naphthyl group, the anthranil group, the benzoyl group, the naphthylcarbonyl group and the anthranilcarbonyl group may be optionally substituted with a hydroxyl group, a halogen atom or both of a hydroxyl group and a halogen atom); p represents an integer of 1 to 3,000; n represents an integer of 0 to 3; the compound contains in the repeating unit thereof, at least one halogen atom.)

Examples of the halogen atom include a fluorine atom, a chlorine atom, a bromine atom or an iodine atom and preferred examples thereof include a bromine atom or an iodine atom.

Preferred examples of A include a benzoyl group, a naphthyl group or a naphthylcarbonyl group (the benzoyl group, the naphthyl group and the naphthylcarbonyl group may be optionally substituted with a hydroxyl group, a halogen atom or both of a hydroxyl group and a halogen atom), more specifically a benzoyl group, a 1,6-dibromo-2-naphthyl group, a 2-naphthylcarbonyl group, a 4-hydroxybenzoyl group, a 3,5-diiodo-2-hydroxybenzoyl group, a 3,5-dibromobenzoyl group and a 3,5-dibromo-2-hydroxybenzoyl group.

[Chemical Formula 34]

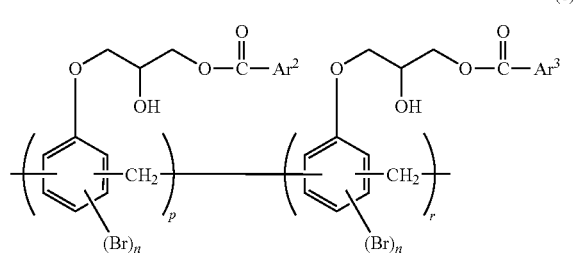

(where, $Ar^2$ and $Ar^3$ are different from each other and individually represent a phenyl group, a naphthyl group or an anthranil group (the phenyl group, the naphthyl group and the anthranil group may be optionally substituted with a hydroxyl group, a halogen atom or both of a hydroxyl group and a halogen atom); q and r individually represent an integer of 1 or more and q+r represents an integer of 2 to 3,000; n represents an integer of 0 to 3; the compound contains at least one halogen atom in the repeating unit containing a substituent $Ar^2$, at least one halogen atom in the repeating unit containing a substituent $Ar^3$, or at least one halogen atom in each of both of the repeating unit containing a substituent $Ar^2$ and the repeating unit containing a substituent $Ar^3$.)

Preferred examples of $Ar^2$ include a naphthyl group, specifically a 2-naphthyl group. Preferred examples of $Ar^3$ include an anthranil group, specifically a 9-anthranil group.

[Chemical Formula 35]

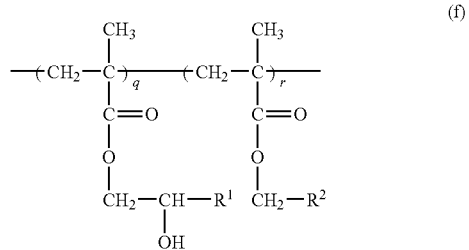

(f)

[where, $R^1$ represents a hydrogen atom or a $C_{1-4}$ alkyl group; $R^2$ represents $CF_3$, $CCl_3$, $CBr_3$, $CH(OH)CH_2OR^3$ (where, $R^3$ represents a phenyl group, a naphthyl group or an anthranil group (the phenyl group, the naphthyl group and the anthranil group may be optionally substituted with a hydroxyl group, a halogen atom or both of a hydroxyl group and a halogen atom)) or $CH(OH)CH_2OC(O)R^4$ (where, $R^4$ represents a phenyl group, a naphthyl group or an anthranil group (the phenyl group, the naphthyl group and the anthranil group may be optionally substituted with a hydroxyl group, a halogen atom or both of a hydroxyl group and a halogen atom)); q and r individually represent an integer of 1 or more and q+r represents an integer of 2 to 3,000; the compound contains at least one halogen atom in the repeating unit containing a substituent $R^2$.]

Examples of the halogen atom include a fluorine atom, a chlorine atom, a bromine atom or an iodine atom.

Examples of the $C_{1-4}$ alkyl group include a methyl group, an ethyl group, an n-propyl group, an isopropyl group, an n-butyl group, an isobutyl group, an s-butyl group or a tert-butyl group, and a methyl group is preferred.

Preferred examples of $R^1$ include a hydrogen atom and a methyl group.

Preferred examples of $R^3$ include a naphthyl group (the naphthyl group may be optionally substituted with a hydroxyl group, a halogen atom or both of a hydroxyl group and a halogen atom), specifically 1,6-dibromo-2-naphthyl group.

Preferred examples of $R^4$ include a phenyl group (the phenyl group may be optionally substituted with a hydroxyl group, a halogen atom or both of a hydroxyl group and a halogen atom), specifically 3,5-diiodo-2-hydroxyphenyl group.

As a catalyst for accelerating the crosslinking reaction, there can be blended in the composition an acidic compound such as p-toluene sulfonic acid, trifluoromethane sulfonic acid, pyridinium p-toluene sulfonic acid, salicylic acid, sulfosalicylic acid, citric acid, benzoic acid and hydroxybenzoic acid and/or a thermo acid generator such as 2,4,4,6-tetrabromocyclohexadienone, benzoin tosylate and 2-nitrobenzyl tosylate. The blending amount of the catalyst is 0.02 to 10% by mass, preferably 0.04 to 5% by mass, relative to 100% by mass of the total mass of the solid content.

In the resist underlayer film forming composition for electron beam lithography of the present invention, an acid generator generating an acid by being irradiated by an electron beam can be added for conforming the acidity of the resist underlayer film with that of the resist to be coated on the resist underlayer film during a lithography process. Preferred examples of the acid generator include: onium salt-based acid generators such as bis(4-tert-butylphenyl)iodoniumtrifluoromethane sulfonate and triphenylsulfoniumtrifluoromethane sulfonate; halogen-containing compound-based acid generators such as phenyl-bis(trichloromethyl)-s-triazine; and sulfonic acid-based acid generators such as benzoin tosylate and N-hydroxysuccinimidetrifluoromethane sulfonate. The additive amount of the acid generator is 0.02 to 3% by mass, preferably 0.04 to 2% by mass, relative to 100% by mass of the total mass of the solid content.

In the resist underlayer film forming composition for electron beam lithography of the present invention, besides the above substances as necessary, a rheology controlling agent, an adhesion aid, a surfactant etc. can be added.

The rheology controlling agent is added to the resist underlayer film forming composition mainly for the purpose of enhancing the fluidity of the composition. Specific examples of the rheology controlling agent include: phthalic acid derivatives such as dimethyl phthalate, diethyl phthalate, diisobutyl phthalate, dihexyl phthalate and butylisodecyl phthalate; adipic acid derivatives such as di-n-butyl adipate, diisobutyl adipate, diisooctyl adipate and octyldecyl adipate; maleic acid derivatives such as di-n-butyl maleate, diethyl maleate and dinonyl maleate; oleic acid derivatives such as methyl oleate, butyl oleate and tetrahydrofurfuryl oleate; or stearic acid derivatives such as n-butyl stearate and glyceryl stearate. The rheology controlling agent is usually blended in an amount of less than 30% by mass, relative to 100% by mass of the total mass of the resist underlayer film forming composition.

The adhesion aid is added to the resist underlayer film forming composition mainly for the purpose of enhancing the adhesion of the composition with the substrate or with the photoresist, particularly for the purpose of preventing the photoresist from peeling during development. Specific examples of the adhesion aid include: chlorosilanes such as trimethylchlorosilane, dimethylvinylchlorosilane, methyldiphenylchlorosilane and chloromethyldimethylchlorosilane; alkoxysilanes such as trimethylmethoxysilane, dimethyldiethoxysilane, methyldimethoxysilane, dimethylvinylethoxysilane, diphenyldimethoxysilane and phenyltriethoxysilane; silazanes such as hexamethyldisilazane, N,N'-bis(trimethlsilyl) urea, dimethyltrimethylsilylamine and trimethylsilylimidazol; silanes such as vinyltrichlorosilane, γ-chloropropyltrimethoxysilane, γ-aminopropyltriethoxysilane and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzooxazole, urazole, thiouracil, mercaptoimidazole and mercaptopyrimidine; and urea compounds such as 1,1-dimethyl urea and 1,3-dimethyl urea or thiourea compounds. The adhesion aid is usually blended in the resist underlayer film forming composition in an amount of less than 5% by mass, preferably less than 2% by mass, relative to 100% by mass of the total mass of the composition.

In the resist underlayer film forming composition for electron beam lithography of the present invention, a surfactant can be blended for causing no pin hole, no stration, and the like and for further enhancing the coating property relative to a surface unevenness. Examples of the surfactant include: nonionic surfactants including polyoxyethylene alkyl ethers such as polyoxyethylene lauryl ether, polyoxyethylene stearyl ether, polyoxyethylene cetyl ether and polyoxyethylene oleyl ether, polyoxyethylene alkylallyl ethers such as polyoxyethylene octylphenol ether and polyoxyethylene nonylphenol ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorine-based surfactants including EFTOP EF301, EF303 and EF352 (manufactured by Mitsubishi Materials Electronic Chemicals Co., Ltd.), MEGAFAC F171 and F173 (manufactured by DIC Corporation), Fluorad FC430 and FC431 (manufactured by Sumitomo 3M Limited), Asahi Guard AG710 and Surfron S-382, SC101, SC102, SC103, SC104, SC105 and SC 106 (manufactured by Asahi Glass Co., Ltd.); and Organosiloxane polymer KP341 (manufactured by Shin-Etsu Chemical Co., Ltd.). The blending amount of the surfactant in the resist underlayer film forming composition for electron beam lithography of the present invention is usually 0.2% by mass or less, preferably 0.1% by mass or less, relative to 100% by mass of the total mass of the composition. The surfactant may be added individually or in combination of two or more types thereof.

Examples of the solvent that can be used for dissolving the above polymer include ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate and butyl lactate. These organic solvents are used singly or in combination of two or more types thereof.

Furthermore, these solvents may be used by mixing with a high-boiling point solvent such as propylene glycol monobutyl ether and propylene glycol monobutyl ether acetate. Among these solvents, propylene glycol monomethyl ether, propylene glycol monomethyl ether acetate, ethyl lactate, butyl lactate and cyclohexanone are preferred for enhancing the leveling property.

As an electron beam resist to be coated on the resist underlayer film for electron beam lithography according to the present invention, both of a negative-type resist and a positive-type resist can be used. Examples of the resist include: a chemical amplification type resist containing a binder having a group changing the alkali dissolving rate by being decomposed by an acid generator and an acid; a chemical amplification type resist containing an alkali-soluble binder and a low molecule compound changing the alkali dissolving rate of a resist by being decomposed by an acid generator and an acid; a chemical amplification type resist containing a binder having a group changing the alkali dissolving rate by being decomposed by an acid generator and an acid, and a low molecule compound changing the alkali dissolving rate of a resist by being decomposed by an acid; a non-chemical amplification type resist containing a binder having a group changing the alkali dissolving rate by being decomposed by an electron beam; and a non-chemical amplification type resist containing a binder having a site changing the alkali dissolving rate by being broken by an electron beam.

Examples of the developer that can be used for a positive-type resist having a resist underlayer film formed by using the resist underlayer film forming composition for electron beam lithography of the present invention include aqueous solutions of alkalis: for example, inorganic alkalis such as sodium hydroxide, potassium hydroxide, sodium carbonate, sodium silicate, sodium metasilicate and ammonia water; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide and choline; and cyclic amines such as pyrrole and piperidine. Furthermore, to an aqueous solution of the above alkalis, an appropriate amount of alcohols such as isopropyl alcohol and a surfactant such as a nonion-type surfactant can be added to be used. Among these developers, preferred developers are quaternary ammonium salts and more preferred developers are tetramethylammonium hydroxide and choline.

A resist underlayer film produced from the resist underlayer film forming composition for electron beam lithography of the present invention containing a polymer compound having a repeating unit structure containing halogen atoms contains halogen atoms, and consequently, has a relatively large dry-etching rate. In addition, the dry-etching rate can be controlled by varying the content of halogen atoms.

In the present invention, by applying the resist underlayer film forming composition for electron beam lithography on a substrate and by calcining the composition, a resist underlayer film for electron beam lithography is formed.

In the present invention, a semiconductor device is produced by a method including: forming a resist underlayer film for electron beam lithography by applying the resist underlayer film forming composition for electron beam lithography on a substrate having a film to be processed in which a transferred pattern is formed and by calcining the composition; coating the formed resist underlayer film with a resist for electron beam lithography; irradiating an electron beam to the substrate coated with the resist underlayer film for electron beam lithography and the resist for electron beam lithography to develop them; and transferring an image onto the substrate by dry etching to form an integrated circuit element.

A semiconductor device to which the resist underlayer film forming composition for electron beam lithography of the present invention is applied, has a constitution in which a film to be processed to which a pattern is transferred, a resist underlayer film and a resist are formed on a substrate in this order. The resist underlayer film is produced by applying a resist underlayer film forming composition for electron beam lithography including a solvent and a polymer compound having a repeating unit structure containing halogen atoms, on the film to be processed to which the pattern is transferred, and by heat-treating the composition. This resist underlayer film can form a favorable resist pattern in a straight shape by reducing adverse effects caused by a base substrate or an electron beam to obtain a satisfactory margin relative to an electron beam irradiance level. In addition, the present resist underlayer film has a dry-etching rate larger than that of a resist film to be formed on the resist underlayer film and can easily transfer a resist pattern to a base film to be processed by a dry-etching process.

EXAMPLES

Synthesis Example 1

Synthesis of Polymer Compound of Formula (5-42)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring) and 11.6 g of benzoic acid were dissolved in 168.4 g of propylene glycol monomethyl ether, and then 0.56 g of benzyltriethyl ammonium was added to the resultant solution, followed by effecting the reaction at a reflux temperature for 24 hours to obtain a solution of a polymer compound of (5-42). The obtained polymer compound was subjected to a GPC analysis and was found to have a weight average molecular mass, converted into that of standard polystyrene, of 2,500.

Synthesis Example 2

Synthesis of Polymer Compound of Formula (5-43)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring), 6.5 g of 2-naphthalene carboxylic acid and 12.6 g of 9-anthracene carboxylic acid were dissolved in 198.7 g of propylene glycol monomethyl ether, and then 0.56 g of benzyltriethyl ammonium was added to the resultant solution, followed by effecting the reaction at a reflux temperature for 24 hours to obtain a solution of a polymer compound of (5-43). The obtained polymer compound was subjected to a GPC analysis and was found to have a weight average molecular mass, converted into that of standard polystyrene, of 2,800.

Synthesis Example 3

Synthesis of Polymer Compound of Formula (5-44)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring) and 27.0 g of 1,6-dibromo-2-naphthol were dissolved in 231.3 g of propylene glycol monomethyl ether, and then 0.84 g of benzyltriethyl ammonium was added to the resultant solution, followed by effecting the reaction at a reflux temperature for 24 hours to obtain a solution of a polymer compound of Formula (5-44). The obtained polymer compound was subjected to a GPC analysis and was found to have a weight average molecular mass, converted into that of standard polystyrene, of 2,700.

Synthesis Example 4

Synthesis of Polymer Compound of Formula (5-45)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring) and 16.3 g of 2-naphthalene carboxylic acid were dissolved in 187.3 g of propylene glycol monomethyl ether, and then 0.56 g of benzyltriethyl ammonium was added to the resultant solution, followed by effecting the reaction at a reflux temperature for 24 hours to obtain a solution of a polymer compound of Formula (5-45). The obtained polymer compound was subjected to a GPC analysis and was found to have a weight average molecular mass, converted into that of standard polystyrene, of 3,000.

Synthesis Example 5

Synthesis of Polymer Compound of Formula (5-46)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring) and 12.3 g of 4-hydroxybenzoic acid were dissolved in 171.6 g of propylene glycol monomethyl ether, and then 0.56 g of benzyltriethyl ammonium was added to the resultant solution, followed by effecting the reaction at a reflux temperature for 24 hours to obtain a solution of a polymer compound of Formula (5-46). The obtained polymer compound was subjected to a GPC analysis and was found to have a weight average molecular mass, converted into that of standard polystyrene, of 3,200.

Synthesis Example 6

Synthesis of Polymer Compound of Formula (5-47)

30.0 g of brominated epoxyphenolnovolak resin (trade name: BREN-304; manufactured by Nippon Kayaku Co., Ltd.; bromine atom content: 42% by mass, having about 1.5 pieces of bromine atoms per benzene ring) and 34.8 g of 3,5-diiodosalicylic acid were dissolved in 262.7 g of propylene glycol monomethyl ether, and then 0.84 g of benzyltriethyl ammonium was added to the resultant solution, followed by effecting the reaction at a reflux temperature for 24 hours to obtain a solution of a polymer compound of Formula (5-47). The obtained polymer compound was subjected to a GPC analysis and was found to have a weight average molecular mass, converted into that of standard polystyrene, of 3,400.

Synthesis Example 7

Synthesis of Polymer Compound of Formula (5-48)

21 g of glycidyl methacrylate and 39 g of 2-hydroxypropyl methacrylate were dissolved in 242 g of propylene glycol monomethyl ether and then the temperature of the resultant solution was elevated to 70° C. Subsequently, while maintaining the reaction solution at 70° C., 0.6 g of azobisisobutylonitrile was added to the solution, followed by effecting the reaction at 70° C. for 24 hours to obtain a solution of a polymer compound. The obtained polymer compound was subjected to a GPC analysis and was found to have a weight average molecular mass, converted into that of standard polystyrene, of 50,000.

In addition, to 100 g of a solution containing 20 g of the polymer compound, 13 g of 1,6-dibromo-2-naphthol, 0.3 g of benzyltriethylammonium chloride and 454 g of propylene glycol monomethyl ether were added and the reaction was effected at 130° C. for 24 hours to obtain a solution of the polymer compound of Formula (5-48).

Synthesis Example 8

Synthesis of Polymer Compound of Formula (5-49)

21 g of glycidyl methacrylate and 39 g of 2-hydroxypropyl methacrylate were dissolved in 242 g of propylene glycol monomethyl ether and then the temperature of the resultant solution was elevated to 70° C. Subsequently, while maintaining the reaction solution at 70° C., 0.6 g of azobisisobutylonitrile was added to the solution, followed by effecting the reaction at 70° C. for 24 hours to obtain a solution of a polymer compound. The obtained polymer compound was subjected to a GPC analysis and was found to have a weight average molecular mass, converted into that of standard polystyrene, of 50,000.

In addition, to 100 g of a solution containing 20 g of the polymer compound, 17 g of 3,5-diiodosalicylic acid, 0.3 g of benzyltriethylammonium chloride and 469 g of propylene glycol monomethyl ether were added and the reaction was effected at 130° C. for 24 hours to obtain a solution of the polymer compound of Formula (5-49).

Synthesis Example 9

Synthesis of Polymer Compound of Formula (5-50)

5.0 g of 2-hydroxyethyl methacrylate and 25.8 g of trifluoroethyl methacrylate were dissolved in 123.3 g of propylene glycol monomethyl ether and then the temperature of the resultant solution was elevated to 70° C. Subsequently, while maintaining the reaction solution at 70° C., 0.3 g of azobisisobutylonitrile was added to the solution, followed by effecting the reaction at 70° C. for 24 hours to obtain a solution of the polymer compound of Formula (5-50). The obtained polymer compound was subjected to a GPC analysis and was found to have a weight average molecular mass, converted into that of standard polystyrene, of 52,000.

Synthesis Example 10

Synthesis of Polymer Compound of Formula (5-51)

5.0 g of 2-hydroxyethyl methacrylate and 33.4 g of trichloroethyl methacrylate were dissolved in 153.7 g of propylene glycol monomethyl ether and then the temperature of the resultant solution was elevated to 70° C. Subsequently, while maintaining the reaction solution at 70° C., 0.4 g of azobisisobutylonitrile was added to the solution, followed by effecting the reaction at 70° C. for 24 hours to obtain a solution of the polymer compound of Formula (5-51). The obtained polymer compound was subjected to a GPC analysis and was found to have a weight average molecular mass, converted into that of standard polystyrene, of 47,000.

Synthesis Example 11

Synthesis of Polymer Compound of Formula (5-52)

5.0 g of 2-hydroxyethyl methacrylate and 53.9 g of tribromoethyl methacrylate were dissolved in 235.7 g of propylene glycol monomethyl ether and then the temperature of the resultant solution was elevated to 70° C. Subsequently, while maintaining the reaction solution at 70° C., 0.6 g of azobisisobutylonitrile was added to the solution, followed by effecting the reaction at 70° C. for 24 hours to obtain a solution of the polymer compound of Formula (5-52). The obtained polymer compound was subjected to a GPC analysis and was found to have a weight average molecular mass, converted into that of standard polystyrene, of 51,000.

Synthesis Example 12

Synthesis of Polymer Compound of Formula (5-53)

30.0 g of epoxidized phenolnovolak resin and 40.4 g of 3,5-dibromobenzoic acid were dissolved in 285.3 g of propylene glycol monomethyl ether and then 0.91 g of benzyltriethyl ammonium was added to the resultant solution, followed by effecting the reaction at a reflux temperature for 24 hours to obtain a solution of the polymer compound of Formula (5-53). The obtained polymer compound was subjected to a GPC analysis and was found to have a weight average molecular mass, converted into that of standard polystyrene, of 1,800.

Synthesis Example 13

Synthesis of Polymer Compound of Formula (5-54)

30.0 g of epoxidized phenolnovolak resin and 42.7 g of 3,5-dibromosalicylic acid were dissolved in 294.5 g of propylene glycol monomethyl ether and then 0.91 g of benzyltriethyl ammonium was added to the resultant solution, followed by effecting the reaction at a reflux temperature for 24 hours to obtain a solution of the polymer compound of Formula (5-54). The obtained polymer compound was subjected to a GPC analysis and was found to have a weight average molecular mass, converted into that of standard polystyrene, of 1,900.

Synthesis Example 14

Synthesis of Polymer Compound of Formula (5-55)

30.0 g of epoxidized phenolnovolak resin and 37.5 g of 3,5-diiodosalicylic acid were dissolved in 232.5 g of propylene glycol monomethyl ether and then 0.61 g of benzyltriethyl ammonium was added to the resultant solution, followed by effecting the reaction at a reflux temperature for 24 hours to obtain a solution of the polymer compound of Formula (5-55). The obtained polymer compound was subjected to a GPC analysis and was found to have a weight average molecular mass, converted into that of standard polystyrene, of 2,200.

Synthesis Example 15

Synthesis of Polymer Compound of Formula (5-55)

6.0 g of epoxidized cresolnovolak resin and 9.7 g of 3,5-diiodosalicylic acid were dissolved in 183.8 g of propylene glycol monomethyl ether and then 0.23 g of benzyltriethyl ammonium was added to the resultant solution, followed by effecting the reaction at a reflux temperature for 24 hours to obtain a solution of the polymer compound of Formula (5-55). The obtained polymer compound was subjected to a GPC analysis and was found to have a weight average molecular mass, converted into that of standard polystyrene, of 3,700.

Synthesis Example 16

Synthesis of Polymer Compound of Formula (5-56)

6.0 g of epoxidized cresolnovolak resin, 7.3 g of 3,5-diiodosalicylic acid and 0.8 g of salicylic acid were dissolved in 177.7 g of propylene glycol monomethyl ether and then 0.23 g of benzyltriethyl ammonium was added to the resultant solution, followed by effecting the reaction at a reflux temperature for 24 hours to obtain a solution of the polymer compound of Formula (5-56). The obtained polymer compound was subjected to a GPC analysis and was found to have a weight average molecular mass, converted into that of standard polystyrene, of 3,500.

Synthesis Example 17

Synthesis of Polymer Compound of Formula (5-56)

6.0 g of epoxidized cresolnovolak resin, 4.7 g of 3,5-diiodosalicylic acid and 1.7 g of salicylic acid were dissolved in 171.6 g of propylene glycol monomethyl ether and then 0.23 g of benzyltriethyl ammonium was added to the resultant solution, followed by effecting the reaction at a reflux temperature for 24 hours to obtain a solution of the polymer compound of Formula (5-56). The obtained polymer compound was subjected to a GPC analysis and was found to have a weight average molecular mass, converted into that of standard polystyrene, of 3,500.

Synthesis Example 18

Synthesis of Polymer Compound of Formula (5-56)

6.0 g of epoxidized cresolnovolak resin, 2.5 g of 3,5-diiodosalicylic acid and 2.6 g of salicylic acid were dissolved in 165.1 g of propylene glycol monomethyl ether and then 0.23 g of benzyltriethyl ammonium was added to the resultant solution, followed by effecting the reaction at a reflux temperature for 24 hours to obtain a solution of the polymer compound of Formula (5-56). The obtained polymer compound was subjected to a GPC analysis and was found to have a weight average molecular mass, converted into that of standard polystyrene, of 3,400.

Example 1

To 10 g of a propylene glycol monomethyl ether solution containing 2 g of the polymer compound obtained in Synthesis Example 1, 0.5 g of tetrabutoxymethyl glycoluril, 0.01 g of p-toluene sulfonic acid, 0.04 g of pyridinium p-toluene sulfonic acid and 0.004 g of MEGAFAC R-30 (surfactant; manufactured by DIC Corporation) were mixed and the resultant mixture was dissolved in 49.8 g of propylene glycol monomethyl ether, 16.5 g of propylene glycol monomethyl ether acetate and 8.3 g of cyclohexanone to prepare a solution. Subsequently, the solution was filtered using a polyethylene-made microfilter having a pore diameter of 0.10 μM and further filtered using a polyethylene-made microfilter having a pore diameter of 0.05 μm to prepare a resist underlayer film forming composition.

Example 2

The preparation of a resist underlayer film forming composition was performed in substantially the same manner as in Example 1, except that the polymer compound of Synthesis Example 1 was changed to the polymer compound of Synthesis Example 2 to obtain the composition of Example 2.

Example 3

The preparation of a resist underlayer film forming composition was performed in substantially the same manner as in Example 1, except that the polymer compound of Synthesis Example 1 was changed to the polymer compound of Synthesis Example 3 to obtain the composition of Example 3.

Example 4

The preparation of a resist underlayer film forming composition was performed in substantially the same manner as in Example 1, except that the polymer compound of Synthesis Example 1 was changed to the polymer compound of Synthesis Example 4 to obtain the composition of Example 4.

Example 5

The preparation of a resist underlayer film forming composition was performed in substantially the same manner as in Example 1, except that the polymer compound of Synthesis Example 1 was changed to the polymer compound of Synthesis Example 5 to obtain the composition of Example 5.

Example 6

The preparation of a resist underlayer film forming composition was performed in substantially the same manner as in Example 1, except that the polymer compound of Synthesis Example 1 was changed to the polymer compound of Synthesis Example 6 to obtain the composition of Example 6.

Example 7

The preparation of a resist underlayer film forming composition was performed in substantially the same manner as in Example 1, except that the polymer compound of Synthesis Example 1 was changed to the polymer compound of Synthesis Example 7 to obtain the composition of Example 7.

Example 8

The preparation of a resist underlayer film forming composition was performed in substantially the same manner as in Example 1, except that the polymer compound of Synthesis Example 1 was changed to the polymer compound of Synthesis Example 8 to obtain the composition of Example 8.

Example 9

The preparation of a resist underlayer film forming composition was performed in substantially the same manner as in Example 1, except that the polymer compound of Synthesis Example 1 was changed to the polymer compound of Synthesis Example 9 to obtain the composition of Example 9.

Example 10

The preparation of a resist underlayer film forming composition was performed in substantially the same manner as in Example 1, except that the polymer compound of Synthesis Example 1 was changed to the polymer compound of Synthesis Example 10 to obtain the composition of Example 10.

Example 11

The preparation of a resist underlayer film forming composition was performed in substantially the same manner as in Example 1, except that the polymer compound of Synthesis Example 1 was changed to the polymer compound of Synthesis Example 11 to obtain the composition of Example 11.

Example 12

The preparation of a resist underlayer film forming composition was performed in substantially the same manner as in Example 1, except that the polymer compound of Synthesis Example 1 was changed to the polymer compound of Synthesis Example 12 to obtain the composition of Example 12.

Example 13

The preparation of a resist underlayer film forming composition was performed in substantially the same manner as in Example 1, except that the polymer compound of Synthesis Example 1 was changed to the polymer compound of Synthesis Example 13 to obtain the composition of Example 13.

Example 14

The preparation of a resist underlayer film forming composition was performed in substantially the same manner as in Example 1, except that the polymer compound of Synthesis Example 1 was changed to the polymer compound of Synthesis Example 14 to obtain the composition of Example 14.

Example 15

The preparation of a resist underlayer film forming composition was performed in substantially the same manner as in Example 1, except that tetrabutoxymethyl glycoluril was changed to hexamethoxy methylolmelamine to obtain the composition of Example 15.

Example 16

The preparation of a resist underlayer film forming composition was performed in substantially the same manner as in Example 1, except that the polymer compound of Synthesis Example 1 was changed to the polymer compound of Synthesis Example 2 and tetrabutoxymethyl glycoluril was changed to hexamethoxy methylolmelamine to obtain the composition of Example 16.

Example 17

The preparation of a resist underlayer film forming composition was performed in substantially the same manner as in Example 1, except that the polymer compound of Synthesis Example 1 was changed to the polymer compound of Synthesis Example 3 and tetrabutoxymethyl glycoluril was changed to hexamethoxy methylolmelamine to obtain the composition of Example 17.

Example 18

The preparation of a resist underlayer film forming composition was performed in substantially the same manner as in Example 1, except that the polymer compound of Synthesis Example 1 was changed to the polymer compound of Synthesis Example 4 and tetrabutoxymethyl glycoluril was changed to hexamethoxy methylolmelamine to obtain the composition of Example 18.

Example 19

The preparation of a resist underlayer film forming composition was performed in substantially the same manner as in Example 1, except that the polymer compound of Synthesis Example 1 was changed to the polymer compound of Synthesis Example 5 and tetrabutoxymethyl glycoluril was changed to hexamethoxy methylolmelamine to obtain the composition of Example 19.

Example 20

The preparation of a resist underlayer film forming composition was performed in substantially the same manner as in Example 1, except that the polymer compound of Synthesis Example 1 was changed to the polymer compound of Synthesis Example 6 and tetrabutoxymethyl glycoluril was changed to hexamethoxy methylolmelamine to obtain the composition of Example 20.

Example 21

The preparation of a resist underlayer film forming composition was performed in substantially the same manner as in Example 1, except that the polymer compound of Synthesis Example 1 was changed to the polymer compound of Synthesis Example 7 and tetrabutoxymethyl glycoluril was changed to hexamethoxy methylolmelamine to obtain the composition of Example 22.

Example 22

The preparation of a resist underlayer film forming composition was performed in substantially the same manner as in Example 1, except that the polymer compound of Synthesis Example 1 was changed to the polymer compound of Synthesis Example 8 and tetrabutoxymethyl glycoluril was changed to hexamethoxy methylolmelamine to obtain the composition of Example 22.

Example 23

The preparation of a resist underlayer film forming composition was performed in substantially the same manner as in Example 1, except that the polymer compound of Synthesis Example 1 was changed to the polymer compound of Synthesis Example 9 and tetrabutoxymethyl glycoluril was changed to hexamethoxy methylolmelamine to obtain the composition of Example 23.

Example 24

The preparation of a resist underlayer film forming composition was performed in substantially the same manner as in Example 1, except that the polymer compound of Synthesis Example 1 was changed to the polymer compound of Synthesis Example 10 and tetrabutoxymethyl glycoluril was changed to hexamethoxy methylolmelamine to obtain the composition of Example 24.

Example 25

The preparation of a resist underlayer film forming composition was performed in substantially the same manner as in Example 1, except that the polymer compound of Synthesis Example 1 was changed to the polymer compound of Synthesis Example 11 and tetrabutoxymethyl glycoluril was changed to hexamethoxy methylolmelamine to obtain the composition of Example 25.

Example 26

The preparation of a resist underlayer film forming composition was performed in substantially the same manner as in Example 1, except that the polymer compound of Synthesis Example 1 was changed to the polymer compound of Synthesis Example 12 and tetrabutoxymethyl glycoluril was changed to hexamethoxy methylolmelamine to obtain the composition of Example 26.

Example 27

The preparation of a resist underlayer film forming composition was performed in substantially the same manner as in Example 1, except that the polymer compound of Synthesis Example 1 was changed to the polymer compound of Synthesis Example 13 and tetrabutoxymethyl glycoluril was changed to hexamethoxy methylolmelamine to obtain the composition of Example 27.

Example 28

The preparation of a resist underlayer film forming composition was performed in substantially the same manner as in Example 1, except that the polymer compound of Synthesis Example 1 was changed to the polymer compound of Synthesis Example 14 and tetrabutoxymethyl glycoluril was changed to hexamethoxy methylolmelamine to obtain the composition of Example 28.

Example 29

To 10 g of a propylene glycol monomethyl ether solution containing 2 g of the polymer compound obtained in Synthesis Example 15, 0.5 g of tetrabutoxymethyl glycoluril, 0.01 g of p-toluene sulfonic acid and 0.04 g of pyridinium p-toluene sulfonic acid were mixed and the resultant mixture was dissolved in 49.8 g of propylene glycol monomethyl ether, 16.5 g of propylene glycol monomethyl ether acetate and 8.3 g of cyclohexanone to prepare a solution. Subsequently, the solution was filtered using a polyethylene-made microfilter having a pore diameter of 0.10 µm and further filtered using a polyethylene-made microfilter having a pore diameter of 0.05 µm to prepare a resist underlayer film forming composition.

Example 30

The preparation of a resist underlayer film forming composition was performed in substantially the same manner as in Example 29, except that the polymer compound of Synthesis Example 15 was changed to the polymer compound of Synthesis Example 16 to obtain the composition of Example 30.

Example 31

The preparation of a resist underlayer film forming composition was performed in substantially the same manner as in Example 29, except that the polymer compound of Synthesis Example 15 was changed to the polymer compound of Synthesis Example 17 to obtain the composition of Example 31.

Example 32

The preparation of a resist underlayer film forming composition was performed in substantially the same manner as in Example 29, except that the polymer compound of Synthesis Example 15 was changed to the polymer compound of Synthesis Example 18 to obtain the composition of Example 32.

Example 33

The preparation of a resist underlayer film forming composition was performed in substantially the same manner as in Example 29, except that tetrabutoxymethyl glycoluril was changed to hexamethoxy methylolmelamine to obtain the composition of Example 33.

Example 34

The preparation of a resist underlayer film forming composition was performed in substantially the same manner as in Example 29, except that the polymer compound of Synthesis Example 15 was changed to the polymer compound of Synthesis Example 16 and tetrabutoxymethyl glycoluril was changed to hexamethoxy methylolmelamine to obtain the composition of Example 34.

Example 35

The preparation of a resist underlayer film forming composition was performed in substantially the same manner as in Example 29, except that the polymer compound of Synthesis Example 15 was changed to the polymer compound of Synthesis Example 17 and tetrabutoxymethyl glycoluril was changed to hexamethoxy methylolmelamine to obtain the composition of Example 35.

Example 36

The preparation of a resist underlayer film forming composition was performed in substantially the same manner as in Example 29, except that the polymer compound of Synthesis Example 15 was changed to the polymer compound of Synthesis Example 18 and tetrabutoxymethyl glycoluril was changed to hexamethoxy methylolmelamine to obtain the composition of Example 36.

(Dissolution Test in Photoresist Solvent)

Each of the resist underlayer film forming compositions prepared in Examples 1 to 36 was applied on a silicon wafer using a spinner. The composition was heated on a hot plate at 205° C. for 1 minute to form a resist underlayer film (having a film thickness of 0.10 µm). The resist underlayer film was immersed in a solvent used for the resist, such as ethyl lactate and propylene glycol monomethyl ether, and it was confirmed that the resist underlayer film was insoluble in the solvent.

(Measurement of Dry Etching Rate)

Each of the resist underlayer film forming compositions prepared in Examples 1 to 36 was applied on a silicon wafer using a spinner. The composition was heated on a hot plate at 205° C. for 1 minute to form a resist underlayer film (having a film thickness of 0.10 µm). Then, the dry etching rate of the underlayer film was measured using RIE system ES401 (manufactured by Nippon Scientific Co., Ltd.).

In addition, in substantially the same manner, a resist solution was applied on a silicon wafer using a spinner to form a coating film. Then, the dry etching rate of the coating film was measured using RIE system ES401 (manufactured by Nippon Scientific Co., Ltd.) and the dry etching rate of the coating film was compared with those of the resist underlayer films of Examples 1 to 36. The result is shown in Table 1.

In Table 1, the dry-etching rate ratio of the coating-type underlayer film of the present invention relative to a resist film (resist underlayer film/resist film) was measured using a $CF_4$ gas as a dry-etching gas.

TABLE 1

| | Dry-etching rate ratio (resist underlayer film/resist film) |
|---|---|
| Example 1 | 1.3 |
| Example 2 | 1.3 |
| Example 3 | 1.5 |
| Example 4 | 1.3 |
| Example 5 | 1.5 |
| Example 6 | 1.7 |
| Example 7 | 1.5 |
| Example 8 | 1.7 |
| Example 9 | 2.3 |
| Example 10 | 2.7 |
| Example 11 | 3.2 |
| Example 12 | 1.3 |
| Example 13 | 1.5 |
| Example 14 | 1.5 |
| Example 15 | 1.3 |
| Example 16 | 1.3 |
| Example 17 | 1.5 |
| Example 18 | 1.3 |
| Example 19 | 1.5 |
| Example 20 | 1.7 |
| Example 21 | 1.5 |
| Example 22 | 1.7 |
| Example 23 | 2.3 |
| Example 24 | 2.7 |
| Example 25 | 3.2 |
| Example 26 | 1.3 |
| Example 27 | 1.5 |
| Example 28 | 1.5 |
| Example 29 | 1.7 |
| Example 30 | 1.6 |
| Example 31 | 1.4 |
| Example 32 | 1.2 |
| Example 33 | 1.7 |
| Example 34 | 1.6 |
| Example 35 | 1.4 |
| Example 36 | 1.2 |

(Resist Pattern Forming Test)

The solution obtained in Example 29 was applied on a wafer in which a thermally-oxidized film (having a film thickness of 2 μm) was formed on bare silicon, by using a spinner. The wafer was heated on a hot plate at 205° C. for 1 minute so that a resist underlayer film for electron beam lithography (having a film thickness of 0.03 μm) was formed. On the resist underlayer film for electron beam lithography, a commercially available negative-type resist solution for electron beam lithography was applied by using a spinner and heated on a hot plate to form a resist film (having a film thickness of 0.25 μm). An electron beam was irradiated to this film using an electron beam lithography apparatus (manufactured by Leica Camera AG) through a mask which is set such that after the development, an isolated line having a line width of the resist of 0.1 μm is formed. Subsequently, the film was heated again on a hot plate and after the film was cooled, it was subjected to the development using an alkaline developer for 60 seconds. The obtained resist pattern was observed by a scanning electron microscope.

In substantially the same manner, resist underlayer films for electron beam lithography (having a film thickness of 0.03 μm) were formed from the solutions obtained in Examples 30, 31 and 32 to form resist patterns. The obtained resist patterns were observed by a scanning electron microscope.

Furthermore, on a wafer in which a thermally-oxidized film (having a film thickness of 2 μm) was formed on bare silicon, a commercially available negative-type resist solution for electron beam lithography was directly applied by using a spinner and the wafer was heated on a hot plate so that a resist film (having a film thickness of 0.25 μm) was formed. Then, in substantially the same manner as above, a resist pattern was formed. The obtained resist pattern was observed by a scanning electron microscope.

The relationship between the irradiating energy amount of an electron beam and the resist pattern width in the case where a resist pattern is formed directly on a thermally-oxidized film formed on bare silicon was observed and it was confirmed that when the irradiating energy amount of an electron beam increases by 5.0 μC/cm$^2$, the width of a resist pattern increases by around 60%.

On the other hand, in the case where on a thermally-oxidized film formed on bare silicon, a resist underlayer film for electron beam lithography is formed and further thereon, a resist pattern is formed, it was confirmed that the increased amount of the resist pattern width when the irradiating energy amount of an electron beam increases by 5.0 μC/cm$^2$, reduces by 15% or more (the increased amount is suppressed to 45% or less).

As is apparent from the above descriptions, a resist underlayer film for electron beam lithography formed from the resist underlayer film forming composition for electron beam lithography of the present invention can reduce adverse effects caused by a base substrate or an electron beam to obtain a wide margin relative to an electron beam irradiance level and further, has a dry-etching rate larger than that of a resist.

Embodiments of the resist underlayer film forming composition for electron beam lithography of the present invention have been described above, however, the technical scope of the present invention is not limited to the scope described in the embodiments. To the embodiments, various changes and improvements can be added.

INDUSTRIAL APPLICABILITY

The present invention relates to a resist underlayer film forming composition for electron beam lithography that is used in a device production process using electron beam lithography and is effective for reducing adverse effects caused by a base substrate and an electron beam to obtain a favorable resist pattern, and a method of forming a resist pattern using the resist underlayer film forming composition for electron beam lithography.

The invention claimed is:

1. A method of manufacturing a semiconductor device comprising:
   forming a resist underlayer film for electron beam lithography by applying a resist underlayer film forming composition for electron beam lithography on a substrate having a film to be processed on which a transferring pattern is formed and by heating the composition;
   coating the obtained resist underlayer film with a resist for electron beam lithography; and
   forming an integrated circuit element by: irradiating an electron beam to the substrate coated with the resist underlayer film for electron beam lithography and the resist for electron beam lithography; carrying out development; and performing dry-etching to transfer an image onto the substrate,
   wherein the resist underlayer film forming composition comprises:

a polymer compound having a repeating unit structure that contains a halogen atom,
a solvent, and
a crosslinking agent,
wherein the polymer compound is represented by Formula (1):

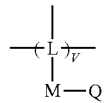

Formula (1)

wherein, L represents a bonding group constituting a backbone of the polymer compound; M represents a direct bond or a linking group containing at least one selected from —C(=O)—, —CH$_2$— and —O—; Q represents an organic group; at least one of L, M and Q contains a halogen atom; and V represents the number of a unit structure contained in the polymer compound, which is the number of 1 to 3,000, and wherein the polymer compound contains at least 10% by mass of the halogen atom, based on the total mass of the polymer compound.

2. The method of claim 1, wherein L in the formula is the backbone of an acrylic or novolak-based polymer compound.

3. The method of claim 1, wherein the halogen atom is a chlorine atom, a bromine atom or an iodine atom.

4. The method of claim 1, wherein the resist underlayer film forming composition for electron beam lithography further comprises a crosslinking catalyst.

5. The method of claim 1, wherein the resist underlayer film forming composition for electron beam lithography further comprises an acid generator.

6. The method of claim 1, wherein the polymer compound has a weight average molecular mass of 500 to 1,000,000.

* * * * *